(12) United States Patent
Hwang et al.

(10) Patent No.: US 12,009,325 B2
(45) Date of Patent: Jun. 11, 2024

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Sung-Min Hwang, Hwaseong-si (KR); Jiwon Kim, Seoul (KR); Jaeho Ahn, Seoul (KR); Joon-Sung Lim, Seongnam-si (KR); Sukkang Sung, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 268 days.

(21) Appl. No.: 17/328,176

(22) Filed: May 24, 2021

(65) Prior Publication Data

US 2022/0139855 A1 May 5, 2022

(30) Foreign Application Priority Data

Nov. 4, 2020 (KR) .......................... 10-2020-0146263

(51) Int. Cl.
*H01L 23/00* (2006.01)
*G11C 16/08* (2006.01)
(Continued)

(52) U.S. Cl.
CPC .............. *H01L 24/08* (2013.01); *G11C 16/08* (2013.01); *G11C 16/10* (2013.01); *H01L 24/80* (2013.01);
(Continued)

(58) Field of Classification Search
CPC .......... H01L 24/02; H01L 24/06; H01L 24/08; H01L 24/10; H01L 24/15; H01L 24/17;
(Continued)

(56) References Cited

U.S. PATENT DOCUMENTS 9,142,517 B2  9/2015 Liu et al.
10,355,039 B2  7/2019 Kotoo et al.
(Continued)

FOREIGN PATENT DOCUMENTS

JP   2011-054637 A   3/2011
KR   10-2017-0139342 A   12/2017

*Primary Examiner* — Robert G Bachner
*Assistant Examiner* — Eric Manuel Mulero Flores
(74) *Attorney, Agent, or Firm* — Fish & Richardson P.C.

(57) ABSTRACT

A semiconductor device and electronic system, the device including a cell structure stacked on a peripheral circuit structure, wherein the cell structure includes a first interlayer dielectric layer and first metal pads exposed at the first interlayer dielectric layer and connected to gate electrode layers and channel regions, the peripheral circuit structure includes a second interlayer dielectric layer and second metal pads exposed at the second interlayer dielectric layer and connected to a transistor, the first metal pads include adjacent first and second sub-pads, the second metal pads include adjacent third and fourth sub-pads, the first and third sub-pads are coupled, and a width of the first sub-pad is greater than that of the third sub-pad, and the second sub-pad and the fourth sub-pad are coupled, and a width of the fourth sub-pad is greater than that of the second sub-pad.

10 Claims, 27 Drawing Sheets

(51) Int. Cl.
*G11C 16/10* (2006.01)
*H01L 25/00* (2006.01)
*H01L 25/065* (2023.01)
*H01L 25/18* (2023.01)
*H10B 41/27* (2023.01)
*H10B 41/41* (2023.01)
*H10B 43/27* (2023.01)
*H10B 43/40* (2023.01)

(52) U.S. Cl.
CPC .......... *H01L 25/0657* (2013.01); *H01L 25/18* (2013.01); *H01L 25/50* (2013.01); *H10B 41/27* (2023.02); *H10B 41/41* (2023.02); *H10B 43/27* (2023.02); *H10B 43/40* (2023.02); *H01L 2224/08135* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC . H01L 24/12; H01L 2224/0601–06179; H01L 2224/0901–09183; H01L 2224/14–14183; H01L 2224/17–17183; H01L 2224/18–244; H01L 2224/25–2543; H01L 2224/80–80986; H01L 2224/81–81053; H01L 2224/8112–81986; H01L 24/03; H01L 24/04; H01L 24/09; H01L 24/14; H01L 24/18–25; H01L 24/80–82; H01L 25/065–0657; H01L 2225/03–06524; H01L 2224/02163; H01L 2224/02333; H01L 2224/02371; H01L 2224/02373; H01L 2224/08145; H01L 2224/10122; H01L 2224/33; H01L 2224/3303; H01L 2224/33051; H01L 2224/4903; H01L 2224/49051; H10B 20/40; H10B 20/60; H10B 41/30; H10B 41/20–27; H10B 41/40–41; H10B 41/50–70; H10B 43/20–50; H10B 20/50–65

See application file for complete search history.

(56) References Cited

U.S. PATENT DOCUMENTS

| | | | |
|---|---|---|---|
| 2013/0009321 A1* | 1/2013 | Kagawa ............ | H01L 27/14609 438/455 |
| 2016/0322376 A1* | 11/2016 | Lee ........................ | H10B 43/40 |
| 2017/0358553 A1 | 12/2017 | Kim et al. | |
| 2019/0237419 A1 | 8/2019 | Enquist | |
| 2019/0296041 A1 | 9/2019 | Yamasaka et al. | |
| 2020/0227131 A1* | 7/2020 | Na ........................ | H01L 25/0652 |
| 2020/0258857 A1* | 8/2020 | Huo ........................ | H01L 25/50 |
| 2020/0350258 A1* | 11/2020 | Lee ........................ | H01L 22/14 |
| 2021/0375790 A1* | 12/2021 | Oda ........................ | H01L 24/80 |
| 2022/0068765 A1* | 3/2022 | Kirby ..................... | H10B 43/40 |

* cited by examiner

SEMICONDUCTOR DEVICE AND ELECTRONIC SYSTEM INCLUDING THE SAME

CROSS-REFERENCE TO RELATED APPLICATION

Korean Patent Application No. 10-2020-0146263 filed on Nov. 4, 2020 in the Korean Intellectual Property Office, and entitled: "Semiconductor Device and Electronic System Including the Same," is incorporated by reference herein in its entirety.

BACKGROUND

1. Field

Embodiments relate to a semiconductor device and an electronic system including the same.

2. Description of the Related Art

A semiconductor device may be capable of storing a large amount of data in an electronic system which requires data storage. Therefore, studies have been conducted to increase data storage capacity of the semiconductor device. For example, as an approach to increase data storage capacity of the semiconductor device, a semiconductor device may include three-dimensionally arranged memory cells instead of two-dimensionally arranged memory cells.

SUMMARY

The embodiments may be realized by providing a semiconductor device, comprising a cell structure stacked on a peripheral circuit structure, wherein the cell structure includes a plurality of gate electrode layers stacked on a first substrate; a plurality of channel regions vertically penetrating the gate electrode layers; a first interlayer dielectric layer on the first substrate and covering the gate electrode layers and the channel regions; and a plurality of first metal pads exposed at the first interlayer dielectric layer and connected to the gate electrode layers and the channel regions, the peripheral circuit structure includes at least one transistor on a second substrate; a second interlayer dielectric layer on the second substrate and covering the transistor; and a plurality of second metal pads exposed at the second interlayer dielectric layer and connected to the transistor, the plurality of first metal pads include at least one first sub-pad and at least one second sub-pad that are adjacent to each other, the plurality of second metal pads include at least one third sub-pad and at least one fourth sub-pad that are adjacent to each other, the at least one first sub-pad and the at least one third sub-pad are coupled to each other, and a width of the at least one first sub-pad is greater than a width of the at least one third sub-pad, and the at least one second sub-pad and the at least one fourth sub-pad are coupled to each other, and a width of the at least one fourth sub-pad is greater than a width of the at least one second sub-pad.

The embodiments may be realized by providing a semiconductor device including a first substrate; a second substrate; a memory cell region that includes at least one first pad and at least one second pad on the first substrate; a peripheral circuit region that includes at least one third pad and at least one fourth pad on the second substrate, the peripheral circuit region being connected through the at least one first pad, the at least one second pad, the at least one third pad, and the at least one fourth pad to the memory cell region; a memory cell array on the memory cell region, the memory cell array including a plurality of cell strings including a plurality of memory cells, a plurality of word lines connected to the memory cells, a plurality of bit lines connected to one side of the cell strings, and a ground selection line connected to the cell strings; a control circuit on the peripheral circuit region, the control circuit including a free charge control circuit that controls ones of the cell strings and a plurality of data program steps for the memory cells; and a row decoder on the peripheral circuit region, the row decoder being configured to activate at least one of the word lines in response to control of the control circuit, wherein the at least one first pad is coupled to the at least one third pad, the at least one second pad is coupled to the at least one fourth pad, and when viewed in a plan view, an area of a planar shape of the at least one first pad is greater than an area of a planar shape of the at least one third pad and an area of a planar shape of the at least one fourth pad is greater than an area of a planar shape of the at least one second pad.

The embodiments may be realized by providing an electronic system including a main board; a semiconductor device on the main board, the semiconductor device including a lower structure and an upper structure stacked on the lower structure; and a controller on the main board and electrically connected to the semiconductor device, wherein the lower structure includes a first semiconductor substrate, a first circuit pattern on the first semiconductor substrate, a first interlayer dielectric layer on the first semiconductor substrate, the first interlayer dielectric layer covering the first circuit pattern, and at least one first metal pad and at least one second metal pad that are exposed at the first interlayer dielectric layer and are connected to the first circuit pattern, and the upper structure includes a second semiconductor substrate, a second circuit pattern on the second semiconductor substrate, a second interlayer dielectric layer on the second semiconductor substrate, the second interlayer dielectric layer covering the second circuit pattern, and at least one third metal pad and at least one fourth metal pad that are exposed at the second interlayer dielectric layer, the at least one third metal pad being coupled to the at least one first metal pad, and the at least one fourth metal pad being coupled to the at least one second metal pad, a width of the at least one first metal pad and a width of the at least one fourth metal pad are greater than a width of the at least one third metal pad and a width of the at least one second metal pad, respectively.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
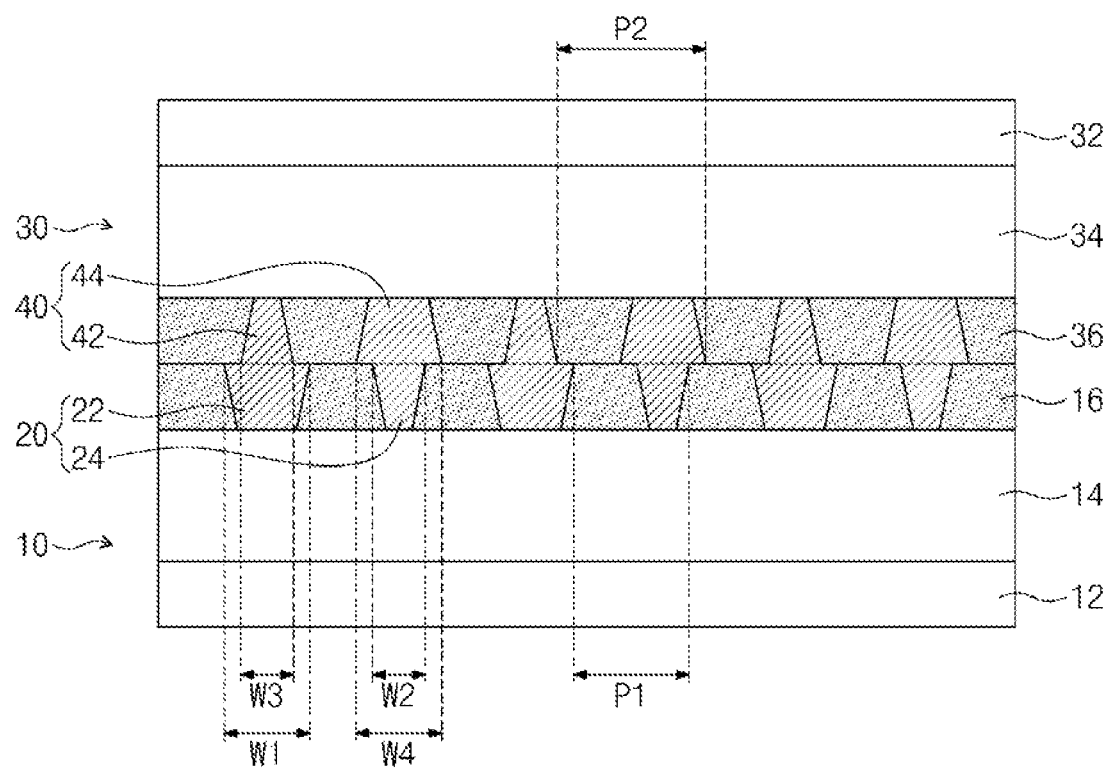
FIGS. 1 to 4 illustrate cross-sectional views of a semiconductor device according to some example embodiments.
Figure 2:
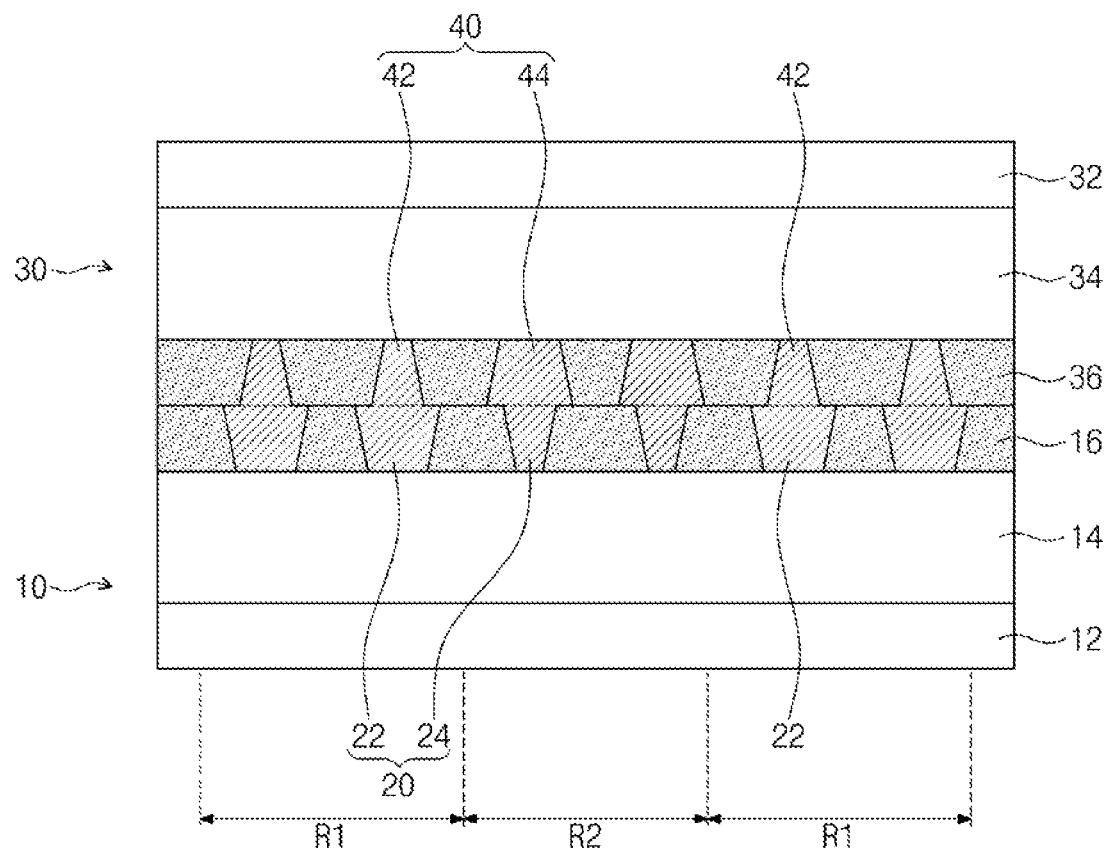

FIGS. 1 and 2 illustrate cross-sectional views of a semiconductor device according to some example embodiments.

Referring to FIG. 1, a semiconductor device may include a lower structure 10 and an upper structure 30 stacked on the lower structure 10.

The lower structure 10 may include a first substrate 12, a first circuit layer 14, a first dielectric layer 16, and first pads 20.

The first substrate 12 may be a semiconductor substrate, e.g., a semiconductor wafer. The first substrate 12 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). The first substrate 12 may include, e.g., silicon (Si), germanium (Ge), silicon germanium (SiGe), gallium arsenic (GaAs), indium gallium arsenic (InGaAs), aluminum gallium arsenic (AlGaAs), or a mixture thereof. In an implementation, the first substrate 12 may be a dielectric substrate. As used herein, the term "or" is not an exclusive term, e.g., "A or B" would include A, B, or A and B.

The first circuit layer 14 may be on the first substrate 12. The first circuit layer 14 may include a first circuit pattern on the first substrate 12 and a dielectric layer that covers the first circuit pattern. The first circuit pattern may be a memory circuit, a logic circuit, or a combination thereof, any of which circuits includes one or more transistors. In an implementation, the first circuit pattern may include a passive element, such as resistor or capacitor.

The first pads 20 may be on the first circuit layer 14. The first pads 20 may be electrically connected to the first circuit pattern of the first circuit layer 14. The first pads 20 may include a metal. In an implementation, the first pads 20 may include copper (Cu). The first pad 20 may have a damascene structure. In an implementation, the first pad 20 may include a seed or barrier layer that covers lateral and bottom surfaces thereof. The first pad 20 may have a width that decreases with decreasing distance from the first substrate 12 (e.g., an inwardly tapered shape). In an implementation, the first pad 20 may have a T-shaped cross-section that includes a via part and a pad part on the via part, which via and pad parts are integrally connected into a single body.

The first pads 20 may include a first sub-pad 22 and a second sub-pad 24. The first sub-pad 22 and the second sub-pad 24 may be (e.g., laterally) adjacent to each other. The first and second sub-pads 22 and 24 may be provided in plural. In an implementation, the plurality of first sub-pads 22 and the plurality of second sub-pads 24 may alternate in a (e.g., horizontal) direction parallel to a top surface of the first substrate 12. In an implementation, a single second sub-pad 24 may be between neighboring first sub-pads 22, and a single first sub-pad 22 may be between neighboring second sub-pads 24. The first sub-pads 22 may each have a width W1 (e.g., maximum width) greater than a width W2 (e.g., maximum width) of each of the second sub-pads 24 (e.g., in the horizontal direction). The width W1 of the first sub-pad 22 may be about 1.2 to 2 times the width W2 of the second sub-pad 24. A distance between a lateral surface of one first sub-pad 22 and a lateral surface of the second sub-pad 24 adjacent to the one first sub-pad 22 may be about 0.1 μm to about 10 μm, e.g., a pitch P1 at which the first and second sub-pads 22 and 24 are arranged may be about 0.1 μm to about 10 The widths W1 and W2 and the pitch P1 of the first and second sub-pads 22 and 24 may be measured at an interface between first and second dielectric layers 16 and 36 which will be discussed below.

A first dielectric layer 16 may be on the first circuit layer 14. The first dielectric layer 16 may surround the first pads 20 on the first circuit layer 14. The first dielectric layer 16 may expose top surfaces (e.g., surfaces facing away from the first substrate 12) of the first pads 20 (e.g., may cover sides of the first pads 20). The first dielectric layer 16 may have a top surface coplanar with those of the first pads 20. The first dielectric layer 16 may include a dielectric material, e.g., silicon oxide (SiO), silicon nitride (SiN), or silicon carbonitride (SiCN).

The upper structure 30 may include a second substrate 32, a second circuit layer 34, a second dielectric layer 36, and second pads 40.

The second substrate 32 may be a semiconductor substrate, e.g., a semiconductor wafer. The second substrate 32 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). The second substrate 32 may include, e.g., silicon (Si), germanium (Ge), silicon germanium (SiGe), gallium arsenic (GaAs), indium gallium arsenic (InGaAs), aluminum gallium arsenic (AlGaAs), or a mixture thereof. In an implementation, the second substrate 32 may be a dielectric substrate.

The second circuit layer 34 may be on the second substrate 32. The second circuit layer 34 may include a second circuit pattern on the second substrate 32 and a dielectric layer that covers the second circuit pattern. The second circuit pattern may be a memory circuit, a logic circuit, or a combination thereof, any of which circuits includes one or more transistors. In an implementation, the second circuit pattern may include a passive element, such as resistor or capacitor.

The second pads 40 may be on the second circuit layer 34. The second pads 40 may be electrically connected to the second circuit pattern of the second circuit layer 34. The second pads 40 may include a metal. In an implementation, the second pads 40 may include copper (Cu). The second pads 40 may each have a damascene structure. In an implementation, the second pad 40 may include a seed or barrier layer that covers lateral and bottom surfaces thereof. The second pad 40 may have a width that decreases with decreasing distance from the second substrate 32 (e.g., a tapered shape). In an implementation, the second pad 40 may have a T-shaped cross-section that includes a via part and a pad part on the via part, which via and pad parts are integrally connected into a single body.

The second pads 40 may include a third sub-pad 42 and a fourth sub-pad 44. The third sub-pad 42 and the fourth sub-pad 44 may be adjacent to each other. The third and fourth sub-pads 42 and 44 may each be provided in plural. In an implementation, the plurality of third sub-pads 42 and the plurality of fourth sub-pads 44 may alternate in a horizontal direction parallel to a top surface of the second substrate 32. The third and fourth sub-pads 42 and 44 may be vertically aligned with the first and second sub-pads 22 and 24, respectively. In an implementation, each of the third sub-pads 42 may be positioned on a single first sub-pad 22, and each of the fourth sub-pads 44 may be positioned on a single second sub-pad 24. The third sub-pads 42 may each have a width W3 less than a width W4 of each of the fourth sub-pads 44 (e.g., in the horizontal direction). The width W4 of the fourth sub-pad 44 may be about 1.2 to 2 times the width W3 of the third sub-pad 42. A distance between a lateral surface of one third sub-pad 42 and a lateral surface of the fourth sub-pad 44 adjacent to the one third sub-pad 42 may be about 0.1 µm to about 10 µm, e.g., a pitch P2 at which the third and fourth sub-pads 42 and 44 are arranged may be about 0.1 µm to about 10 The widths W3 and W4 and the pitch P2 of the third and fourth sub-pads 42 and 44 may be measured at the interface between the first and second dielectric layers 16 and 36 (e.g., may be maximum horizontal widths of the third and fourth sub-pads 42 and 44).

The second dielectric layer 36 may be on the second circuit layer 34. The second dielectric layer 36 may surround the second pads 40 on the second circuit layer 34. The second dielectric layer 36 may expose (e.g., may not cover) top surfaces (e.g., surfaces facing away from the second substrate 32) of the second pads 40. The second dielectric layer 36 may have a top surface coplanar with those of the second pads 40. The second dielectric layer 36 may include a dielectric material, e.g., silicon oxide (SiO), silicon nitride (SiN), or silicon carbonitride (SiCN).

The upper structure 30 may be on the lower structure 10. The upper structure 30 may be connected to the lower structure 10. In an implementation, the first and second dielectric layers 16 and 36 may be bonded to each other. At the interface between the first and second dielectric layers 16 and 36, the first pads 20 of the lower structure 10 may be bonded to the second pads 40 of the upper structure 30. In an implementation, the first and second pads 20 and 40 may constitute an intermetallic hybrid bonding therebetween. In this description, the term "hybrid bonding" may denote a bonding in which two components of the same kind are merged at an interface therebetween. In an implementation, the bonded first and second pads 20 and 40 may have a continuous configuration, e.g., may be a monolithic, one-piece structure in which no boundary or distinct interface may be visually recognized between the first and second pads 20 and 40. In an implementation, the first and second pads 20 and 40 may be formed of the same material, and no interface may be present between the first pads 20 and their corresponding second pads 40. In an implementation, the first and second pads 20 and 40 may be provided as a single component. In an implementation, the first and third sub-pads 22 and 42 may be combined into a single body, and the second and fourth sub-pads 24 and 44 may be combined into a single body. The first sub-pad 22 may have a width greater than that of the third sub-pad 42. In an implementation, the width of the first sub-pad 22 may be about 1.2 to 2 times that of the third sub-pad 42. The first sub-pad 22 may have a planar shape (e.g., shape when viewed in a plan view) having an area that is larger than a planar shape of the third sub-pad 42. The first sub-pad 22 may have an area greater than that of the third sub-pad 42, and when viewed in a plan view, the third sub-pads 42 may be positioned in insides of corresponding first sub-pads 22 (e.g., the planar shape of the third sub-pads 42 may be contained within the planar shape of the first sub-pads 22). The second sub-pad 24 may have a width less than that of the fourth sub-pad 44. In an implementation, the width of the fourth sub-pad 44 may be about 1.2 to 2 times that of the second sub-pad 24. The second sub-pad 24 may have a planar shape having an area that is smaller than a planar shape of the fourth sub-pad 44. The second sub-pad 24 may have an area less than that of the fourth sub-pad 44, and when viewed in a plan view, the second sub-pads 24 may be positioned in insides of corresponding fourth sub-pads 44. A distance between the lateral surfaces of the first and second sub-pads 22 and 24 adjacent to each other (e.g., in the horizontal direction) may be substantially the same as a distance between the lateral surfaces of the third and fourth sub-pads 42 and 44 adjacent to each other (e.g., in the horizontal direction).

In an implementation, one of the first and second pads 20 and 40 may have a larger area. Therefore, even if the upper and lower structures 30 and 10 were to be misaligned due to process errors in semiconductor device fabrication, the second and third sub-pads 24 and 42 having smaller areas may vertically and completely overlap the fourth and first sub-pads 44 and 22 having larger areas, and there may be a uniform contact area between the first and third sub-pads 22 and 42 and between the second and fourth sub-pads 24 and 44. In an implementation, a contact resistance between the first and second pads 20 and 40 may be constant between the first and third sub-pads 22 and 42 and between the second and fourth sub-pads 24 and 44. In an implementation, the semiconductor device may increase in electrical characteristics.

If a lower structure were to be provided with all of pads whose areas are larger, and when an upper structure is provided with all of pads whose areas are smaller, the lower structure could have a narrow interval and/or a short circuit between the pads.

In contrast, according to an embodiment, pads whose areas are larger and pads whose areas are smaller may be alternately arranged on each of the lower and upper structures 10 and 30. Therefore, a wide spacing may be provided between the first pads 20 or between the second pads 40, and a short-circuit may be prevented between the first pads 20 or between the second pads 40. In addition, a large margin of spacing may be provided between the first pads 20 or between the second pads 40, and thus a semiconductor device may be provided to have their pads whose integration is high.

In an implementation, as illustrated in FIG. 1, the first sub-pads 22 and the second sub-pads 24 may be alternately arranged, and the third sub-pads 42 and the fourth sub-pads 44 may be alternately arranged.

Referring to FIG. 2, the first sub-pads 22 may be on a first region R1 of the first substrate 12. The second sub-pads 24 may be on a second region R2 of the first substrate 12. In an implementation, the first pads 20 may be in groups each including at least two first sub-pads 22 or at least two second sub-pads 24, and the groups may be adjacent to each other.

The third sub-pads 42 may be on the second substrate 32 at positions that correspond to (e.g., that overlie or are aligned with) those of the first sub-pads 22, and the fourth sub-pads 44 may be at positions that correspond to those of the second sub-pads 24. In an implementation, the third sub-pads 42 may be on the first region R1. The fourth sub-pads 44 may be on the second region R2. In an implementation, the second pads 40 may be in groups each including at least two third sub-pads 42 or at least two fourth sub-pads 44, and the groups may be adjacent to each other.

The first dielectric layer 16 and the second dielectric layer 36 may be bonded to each other. At the interface between the first and second dielectric layers 16 and 36, the first pads 20 of the lower structure 10 may be coupled to the second pads 40 of the upper structure 30. In an implementation, the first and third sub-pads 22 and 42 may be combined into a single body, and the second and fourth sub-pads 24 and 44 may be combined into a single body. The first sub-pad 22 may have a width greater than that of the third sub-pad 42. The first sub-pad 22 may have a planar shape with an area larger than that of the third sub-pad 42, and when viewed in a plan view, the third sub-pads 42 may be positioned in insides of corresponding first sub-pads 22. The second sub-pad 24 may have a width less than that of the fourth sub-pad 44. The second sub-pad 24 may have a planar shape with an area smaller than that of the fourth sub-pad 44, and when viewed in a plan view, the second sub-pads 24 may be positioned in insides of corresponding fourth sub-pads 44. In an implementation, on the first region R1, the first pads 20 may have their widths greater than those of the second pads 40 bonded thereto, and on the second region R2, the second pads 40 may have their widths greater than those of the first pads 20 bonded thereto.

Figure 3:
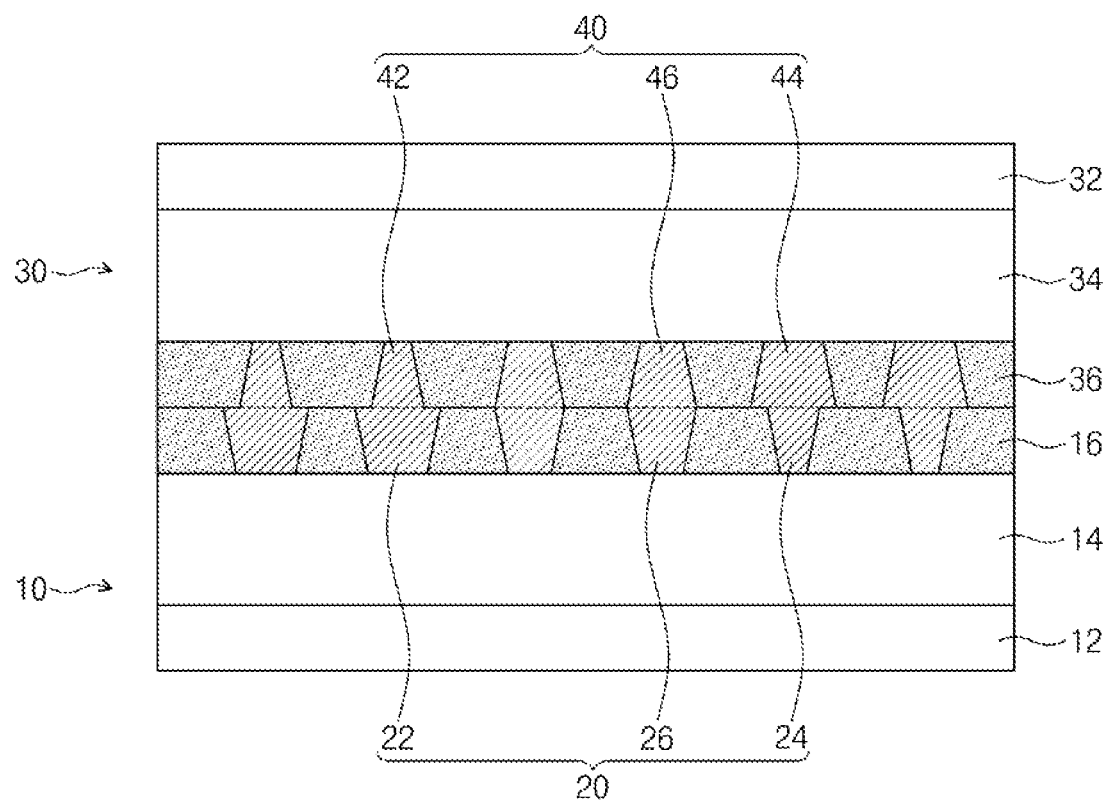

FIG. 3 illustrates a cross-sectional view of a semiconductor apparatus according to some example embodiment.

Referring to FIG. 3, the first pads 20 may further include one or more fifth sub-pads 26 between one of the first sub-pads 22 and its adjacent one of the second sub-pads 24. In this case, the first sub-pads 22 and the second sub-pads 24 may be in groups on the first region R1 and the second region R2, respectively, as illustrated in FIG. 2 or 3. In an implementation, the first sub-pads 22 and the second sub-pads 24 may alternate as illustrated in FIG. 1. The fifth sub-pads 26 may have widths less than those of the first sub-pads 22 and greater than those of the second sub-pads 24. The fifth sub-pads 26 may be connected to the first sub-pads 22 or the second sub-pads 24, or may be wiring patterns connected to the first circuit layer 14.

The second pads 40 may further include one or more sixth sub-pads 46 between one of the third sub-pads 42 and its adjacent one of the fourth sub-pads 44. In this case, the third sub-pads 42 and the fourth sub-pads 44 may be in groups on the first region R1 and the second region R2, respectively, as illustrated in FIG. 2 or 3. In an implementation, the third sub-pads 42 and the fourth sub-pads 44 may alternate as illustrated in FIG. 1. The sixth sub-pads 46 may be at positions that correspond to those of the fifth sub-pads 26. In an implementation, the sixth sub-pads 46 may be positioned on corresponding fifth sub-pads 26. The sixth sub-pads 46 may have widths greater than those of the third sub-pads 42 and less than those of the fourth sub-pads 44. The sixth sub-pads 46 may be connected to the third sub-pads 42 or the fourth sub-pads 44, or may be wiring patterns connected to the second circuit layer 34.

The first dielectric layer 16 and the second dielectric layer 36 may be bonded to each other. At the interface between the first and second dielectric layers 16 and 36, the first pads 20 of the lower structure 10 may be coupled to the second pads 40 of the upper structure 30. The fifth and sixth sub-pads 26 and 46 may be combined into a single body. The fifth and sixth sub-pads 26 and 46 may have the same width. In this case, the fifth sub-pads 26 may be vertically aligned with the sixth sub-pads 46. In an implementation, the fifth sub-pads 26 may have lateral surfaces in contact with or aligned with those of the sixth sub-pads 46 coupled thereto. The fifth sub-pads 26 may have planar shapes that are the same as those of the sixth sub-pads 46.

In an implementation, as illustrated in FIGS. 1 to 3, the first sub-pads 22 may be correspondingly coupled to the third sub-pads 42 and the second sub-pads 24 may be correspondingly coupled to the fourth sub-pads 44.

Figure 4:
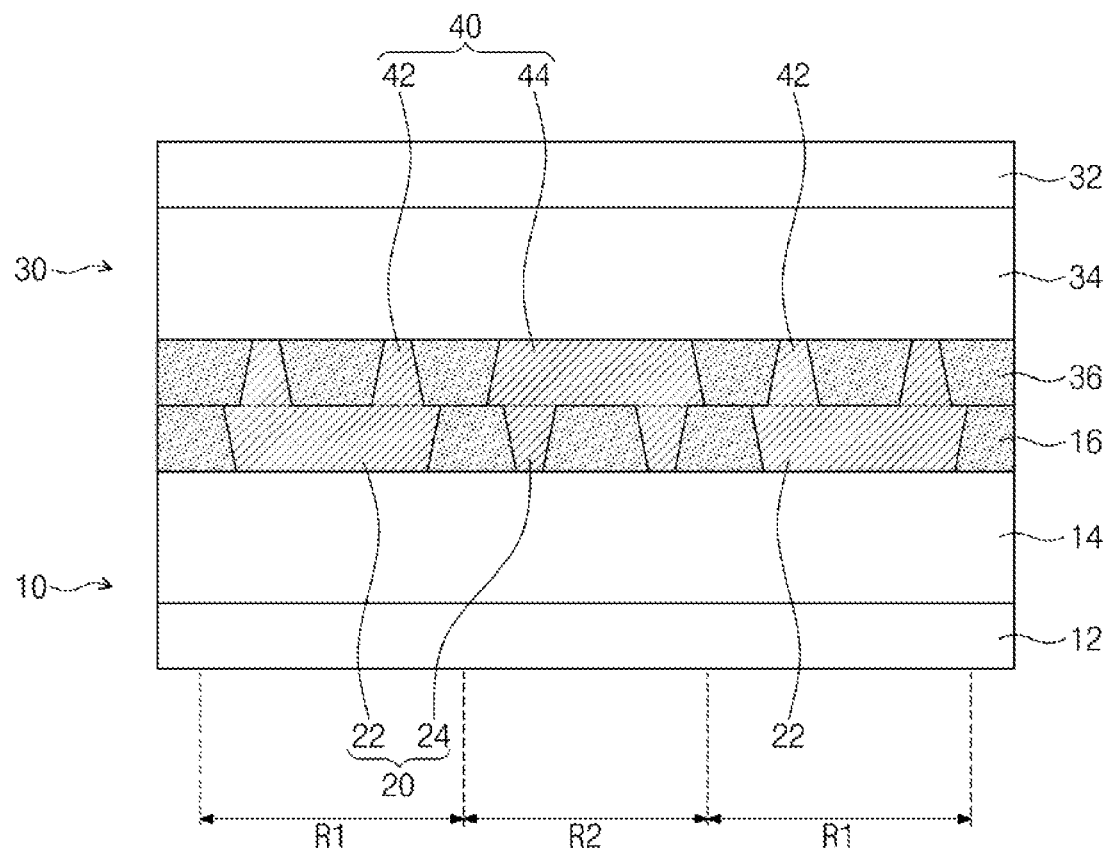

FIG. 4 illustrates a cross-sectional view of a semiconductor device according to some example embodiments.

Referring to FIG. 4, a semiconductor device may be configured such that at least two third sub-pads 42 are coupled to a single first sub-pad 22, and that at least two second sub-pads 24 are coupled to a single fourth sub-pad 44.

At least two second sub-pads 24 may be between neighboring first sub-pads 22. The first sub-pads 22 may have widths greater than those of the second sub-pads 24.

At least two third sub-pads 42 may be between neighboring fourth sub-pads 44. The fourth sub-pads 44 may have widths greater than those of the third sub-pads 42.

The third sub-pads 42 between neighboring fourth sub-pads 44 may be aligned with one of the first sub-pads 22, and the second sub-pads 24 between neighboring first sub-pads 22 may be aligned with one of the fourth sub-pads 44. In an implementation, at least two third sub-pads 42 may be positioned on a single first sub-pad 22, and at least two second sub-pads 24 may be positioned on a single fourth sub-pad 44.

The upper structure 30 may be on the lower structure 10. The upper structure 30 may be connected to the lower structure 10. At the interface between the first and second dielectric layers 16 and 36, the first pads 20 of the lower structure 10 may be bonded to the second pads 40 of the upper structure 30. In this case, the first and second pads 20 and 40 may constitute an intermetallic hybrid bonding therebetween. One of the first sub-pads 22 may be coupled to at least two third sub-pads 42, and one of the fourth sub-pads 44 may be coupled to at least two second sub-pads 24. The first sub-pad 22 may have a width greater than that of the third sub-pad 42. In an implementation, the width of the first sub-pad 22 may be about 2 to 10 times that of the third sub-pad 42. The first sub-pad 22 may have a planar shape with an area larger than that of the third sub-pad 42. When viewed in a plan view, the third sub-pads 42 may be positioned in insides of corresponding first sub-pads 22. The second sub-pad 24 may have a width less than that of the fourth sub-pad 44. In an implementation, the width of the fourth sub-pad 44 may be about 2 to 10 times that of the second sub-pad 24. The second sub-pad 24 may have a planar shape with an area smaller than that of the fourth sub-pad 44. When viewed in a plan view, the second sub-pads 24 may be positioned in insides of corresponding fourth sub-pads 44.

In an implementation, as illustrated in FIG. 4, two third sub-pads 42 and two second sub-pads 24 may be coupled to one first sub-pad 22 and one fourth sub-pad 44, respectively. In an implementation, two or more third sub-pads 42 may be coupled to one first sub-pad 22, and two or more second sub-pads 24 may be coupled to one fourth sub-pad 44.

Figure 5:
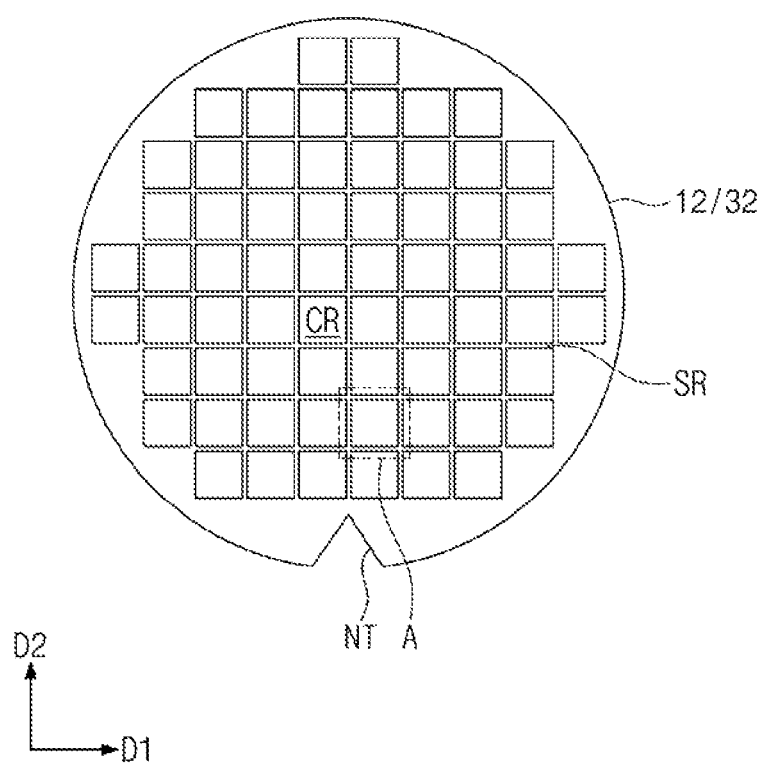
FIG. 5 illustrates a plan view of a substrate with integrated semiconductor devices according to some example embodiments.

FIG. 5 illustrates a plan view of a substrate with integrated semiconductor devices according to some example embodiments, showing that the second substrate 32 is stacked on the first substrate 12.

Referring to FIG. 5, the first substrate 12 and the second substrate 32 may be a semiconductor substrate, such as a semiconductor wafer. The first substrate 12 and the second substrate 32 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). The first substrate 12 and the second substrate 32 may include, e.g., silicon (Si), germanium (Ge), silicon germanium (SiGe), gallium arsenic (GaAs), indium gallium arsenic (InGaAs), aluminum gallium arsenic (AlGaAs), or a mixture thereof. The first substrate 12 and the second substrate 32 may have a single-crystalline structure.

The first substrate 12 and the second substrate 32 may be substantially identical or similar to each other. Each of the first and second substrates 12 and 32 may include chip regions CR on which semiconductor chips are formed and a scribe line region SR between the chip regions CR. The chip regions CR may be two-dimensionally arranged along first and second directions D1 and D2 that cross each other. The scribe line region SR may surround each of the chip regions CR. In an implementation, the scribe line region SR may be between the chip regions CR adjacent to each other in the first direction D1 and between the chip regions CR adjacent to each other in the second direction D2. Each of the first and second substrates 12 and 32 may have a notch NT at its one end in the first direction D1. The first and second substrates 12 and 32 may be stacked in a third direction D3, and their notches NT may be used to align the first and second substrates 12 and 32 with each other. In an implementation, when viewed in a plan view, the chip regions CR and the scribe line region SR of the first substrate 12 may align and overlap with the chip regions CR and the scribe line region SR of the second substrate 32.

In an implementation, a semiconductor device including three-dimensionally arranged memory cells may be formed on each of the chip regions CR of the first and second substrates 12 and 32.

Figure 6:
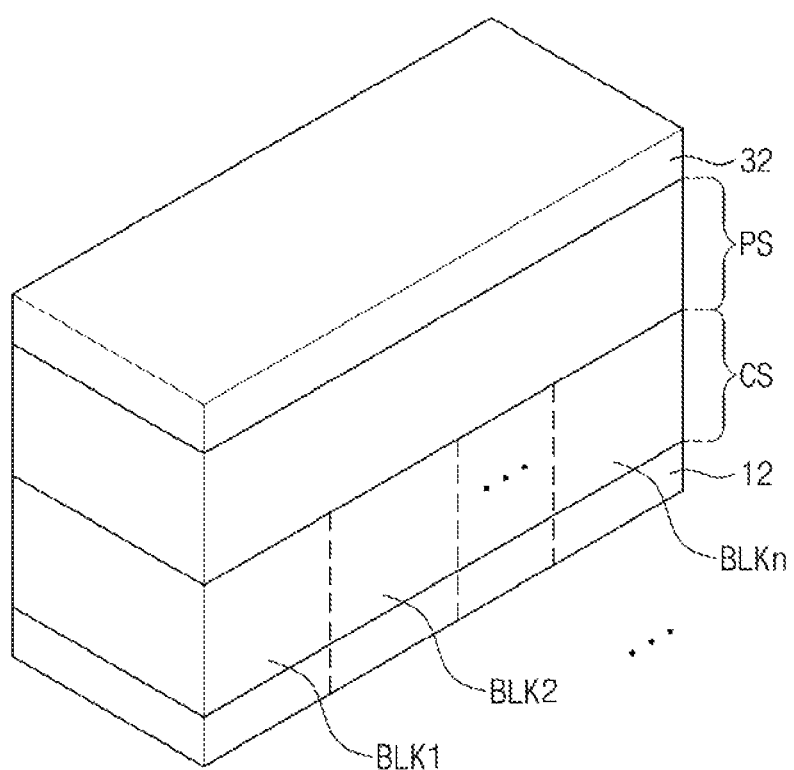
FIG. 6 illustrates a perspective view of a semiconductor device according to some example embodiments.

FIG. 6 illustrates a perspective view showing a semiconductor device according to some example embodiments.

Referring to FIG. 6, a semiconductor device may include a peripheral circuit structure PS and a cell array structure CS, and the peripheral circuit structure PS may be stacked on the cell array structure CS. In an implementation, the cell array structure CS and the peripheral circuit structure PS may overlap each other when viewed in a plan. The peripheral circuit structure PS integrated on the second substrate 32 may be stacked on the cell array structure CS integrated on the first substrate 12, and in this case, the cell array structure CS and the peripheral circuit structure PS may be in contact with each other.

The cell array structure CS may include a cell array including a plurality of three-dimensionally arranged memory cells. In an implementation, the cell array may be integrated on the first substrate 12. In an implementation, the first substrate 12 and the cell array structure CS may correspond to the lower structure 10 discussed with reference to FIG. 1, and the cell array structure CS may correspond to the first circuit layer 14 of FIG. 1.

The cell array structure CS may include one or more mats, and each of the mats may include a plurality of memory blocks BLK1 to BLKn. Each of the memory blocks BLK1 to BLKn may include three-dimensionally arranged memory cells. In an implementation, each of the memory blocks BLK1 to BLKn may include structures that are stacked along the third direction D3 on the first substrate 12.

The peripheral circuit structure PS may include a row decoder, a column decoder, a page buffer, and a control circuit that control a cell array. The second substrate 32 may be provided thereon with integrated peripheral logic circuits that constitute the peripheral circuit structure PS. In an implementation, the second substrate 32 and the peripheral circuit structure PS may correspond to the upper structure 30 discussed with reference to FIG. 1, and the peripheral circuit structure PS may correspond to the second circuit layer 34 of FIG. 1.

Figure 7:
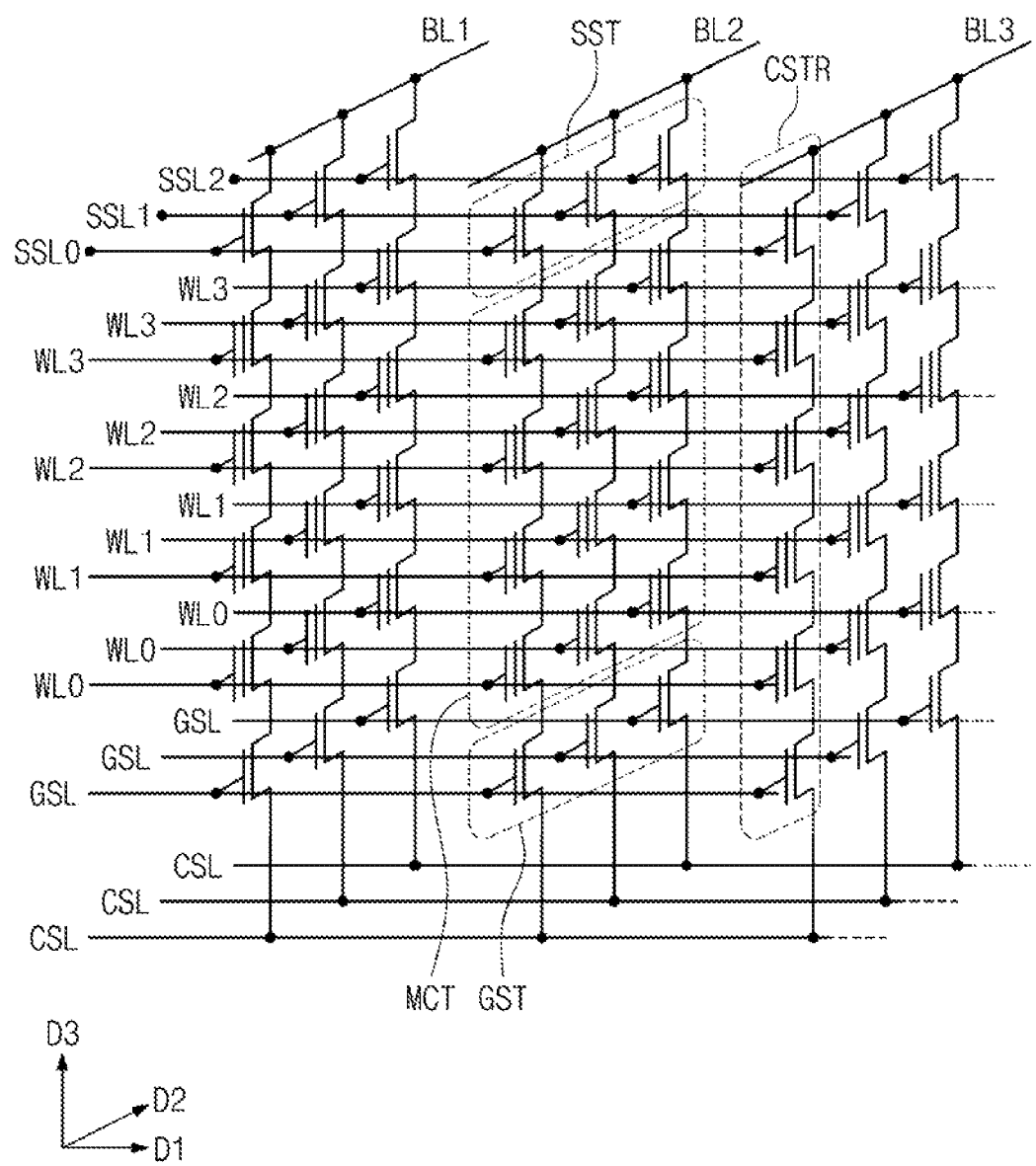
FIG. 7 illustrates a circuit diagram of a cell array of a semiconductor device according to some example embodiments.

FIG. 7 illustrates a circuit diagram of a cell array of a semiconductor device according to some example embodiments.

Referring to FIG. 7, a three-dimensional semiconductor device according to some example embodiments may be a three-dimensional NAND Flash memory device. A cell array of the three-dimensional NAND Flash memory device may include a common source line CSL, a plurality of bit lines BL1 to BL3, and a plurality of cell strings CSTR between the common source line CSL and the bit lines BL1 to BL3. The cell strings CSTR may extend along a third direction D3 perpendicular to first and second directions D1 and D2.

The bit lines BL1 to BL3 may be two-dimensionally arranged, and a plurality of cell strings CSTR may be connected in parallel to each of the bit lines BL1 to BL3. The cell strings CSTR may be connected in common to the common source line CSL. For example, a plurality of cell strings CSTR may be between a plurality of bit lines BL1 to BL3 and one common source line CSL. The common source line CSL may be provided in plural arranged two-dimensionally. In this configuration, the common source lines CSL may be supplied with the same voltage or may be electrically controlled independently of each other.

Each of the cell strings CSTR may include a ground selection transistor GST coupled to the common source line CSL, a string selection transistor SST coupled to one of the bit lines BL1 to BL3, and a plurality of memory cell transistors MCT disposed between the ground and string selection transistors GST and SST. The ground selection transistor GST, the string selection transistor SST, and the memory cell transistors MCT may be connected in series. The common source line CSL may be connected in common to sources of the ground selection transistors GST.

A ground selection line GSL, a plurality of word lines WL0 to WL3, and a plurality of string selection lines SSL0 to SSL2 between the common source line CSL and the bit lines BL1 to BL3 may be used as gate electrodes of the ground selection transistor GST, the memory cell transistors MCT, and the string selection transistor SST, respectively. Each of the memory cell transistors MCT may include a data storage element.

Figure 8:
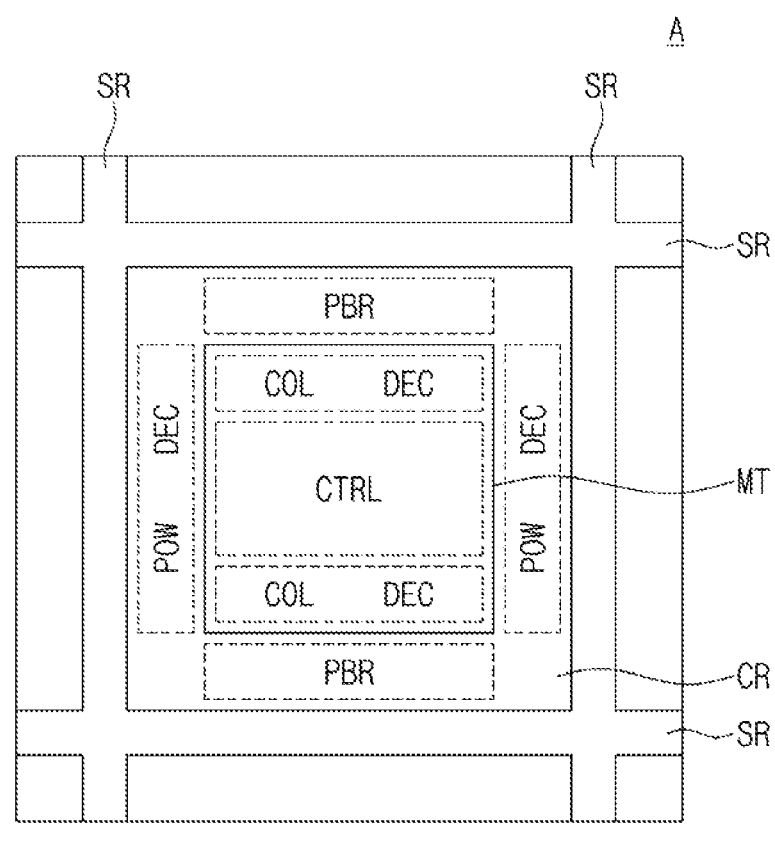
FIGS. 8 and 9 illustrate enlarged plan views of section A in FIG. 4, of a semiconductor device according to some example embodiments.
Figure 9:
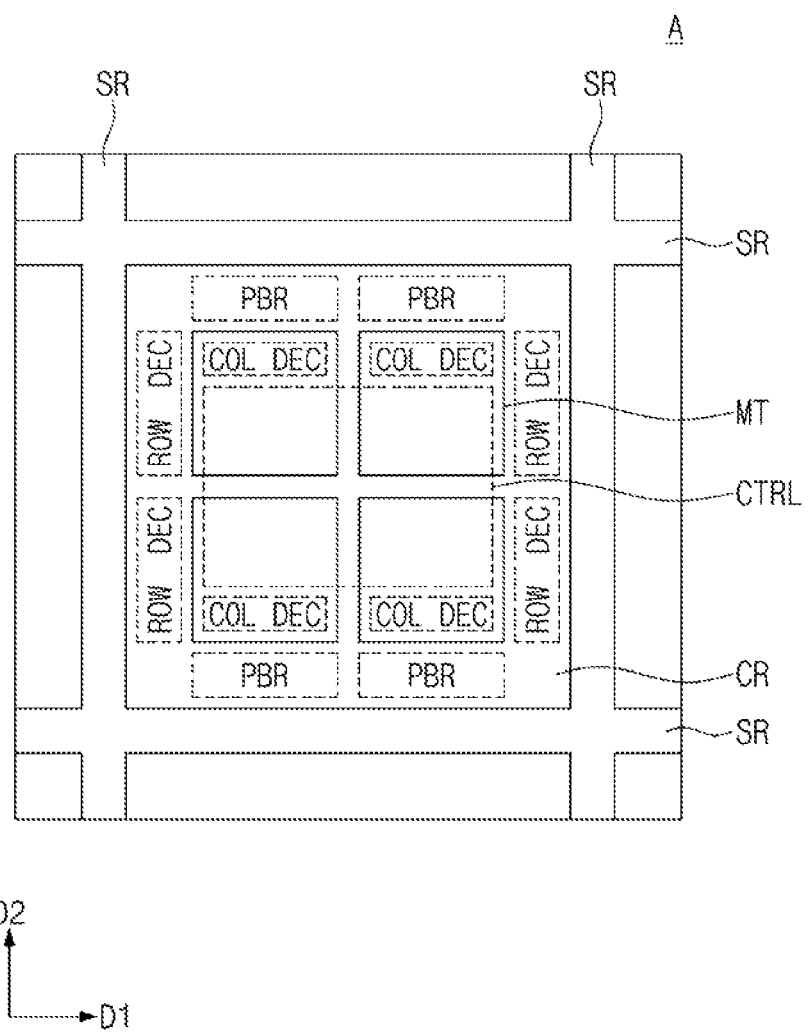

FIGS. 8 and 9 illustrate enlarged plan views of section A in FIG. 4, of a semiconductor device according to some example embodiments.

Referring to FIGS. 5, 8, and 9, the chip regions CR of the second substrate 32 that include the peripheral circuit structure (see PS of FIG. 6) may be correspondingly disposed on the chip regions CR of the first substrate 12 that include the cell array structure (see CS of FIG. 6).

Each chip region CR of the second substrate 32 may be provided thereon with the peripheral circuit structure PS that includes row decoders ROW DEC, column decoders COL DEC, page buffers PBR, and a control circuit CTRL. The chip regions CR may be surrounded by the scribe line region SR, and the scribe line region SR may be used for singulation of three-dimensional semiconductor devices when a sawing process is performed in fabricating three-dimensional semiconductor devices.

Referring to FIG. 8, on each of the chip regions CR, one mat MT or one block may constitute the cell array structure (see CS of FIG. 6). In an implementation, the mat MT may be on the first substrate (see 12 of FIG. 6). One mat MT may overlap a portion of the peripheral circuit structure (see PS of FIG. 6). In an implementation, when viewed in a plan view, the row decoders ROW DEC and the page buffers PBR may be around the mat MT. The column decoders COL DEC and the control circuit CTRL may overlap the mat MT. In an implementation, peripheral circuits constituting the peripheral circuit structure (see PS of FIG. 6) may be freely or arbitrarily on the mat MT.

Referring to FIG. 9, each of the chip regions CR may be provided thereon with a plurality of mats MT or a plurality of blocks that constitute the cell array structure (see CS of FIG. 6). The plurality of mats MT may be arranged along the first and second directions D1 and D2. In an implementation, the plurality of mats MT may be provided on the first substrate (see 12 of FIG. 6).

Figure 10:
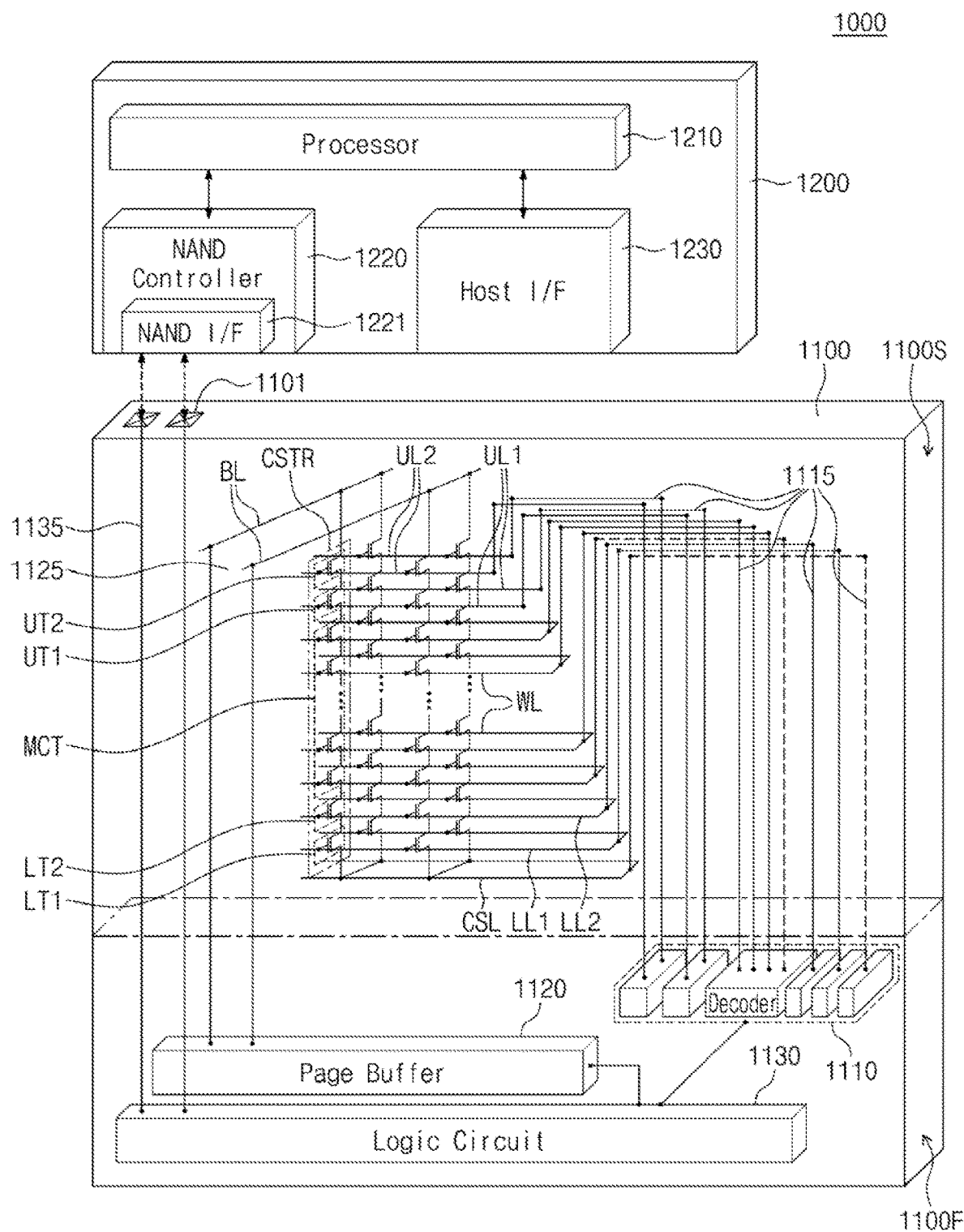
FIG. 10 illustrates a diagram of an electronic system that includes a semiconductor device according to some example embodiments.

FIG. 10 illustrates a schematic diagram of an electronic system that includes a semiconductor device according to some example embodiments.

Referring to FIG. 10, an electronic system 1000 according to some example embodiments may include a semiconductor device 1100 and a controller 1200 electrically connected to the semiconductor device 1100. The electronic system 1000 may be a storage device that includes a single or a plurality of semiconductor devices 1100 or may be an electronic device that includes the storage device. In an implementation, the electronic system 1000 may be a solid state drive (SSD) device, a universal serial bus (USB) device, a computing system, a medical apparatus, or a communication apparatus, each of which includes a single or a plurality of semiconductor devices 1100.

The semiconductor device 1100 may be a nonvolatile memory device, such as a NAND Flash memory device. The semiconductor device 1100 may include a first structure 1100F and a second structure 1100S on the first structure 1100F. In an implementation, the first structure 1100F may be on a side of the second structure 1100S. The first structure 1100F may be a peripheral circuit structure that includes a decoder circuit 1110, a page buffer 1120, and a logic circuit 1130. The second structure 1100S may be a memory cell structure that includes bit lines BL, a common source line CSL, word lines WL, first and second gate upper lines UL1 and UL2, first and second gate lower lines LL1 and LL2, and cell strings CSTR between the bit line BL and the common source line CSL On the second structure 1100S, each of the cell strings CSTR may include lower transistors LT1 and LT2 adjacent to the common source line CSL, upper transistors UT1 and UT2 adjacent to the bit line BL, and memory cell transistors MCT between the lower transistors LT1 and LT2 and the upper transistors UT1 and UT2. The number of the lower transistors LT1 and LT2 and of the upper transistors UT1 and UT2 may be variously changed in accordance with embodiments.

In an implementation, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In an implementation, the lower transistors LT1 and LT2 may include a lower erase control transistor LT1 and a ground selection transistor LT2 that are connected in series. The upper transistors UT1 and UT2 may include a string selection transistor UT1 and an upper erase control transistor UT2 that are connected in series. One or both of the first and second erase control transistors LT1 and UT2 may be employed to perform an erasure operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

On the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

The controller 1200 may include a processor 1210, a NAND controller 1220, and a host interface 1230. In an implementation, the electronic system 1000 may include a plurality of semiconductor devices 1100, and in this case, the controller 1200 may control the plurality of semiconductor devices 1100.

The processor 1210 may control overall operations of the electronic system 1000 including the controller 1200. The processor 1210 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor device 1100, data which is intended to be written on the memory cell transistors MCT of the semiconductor device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 11:
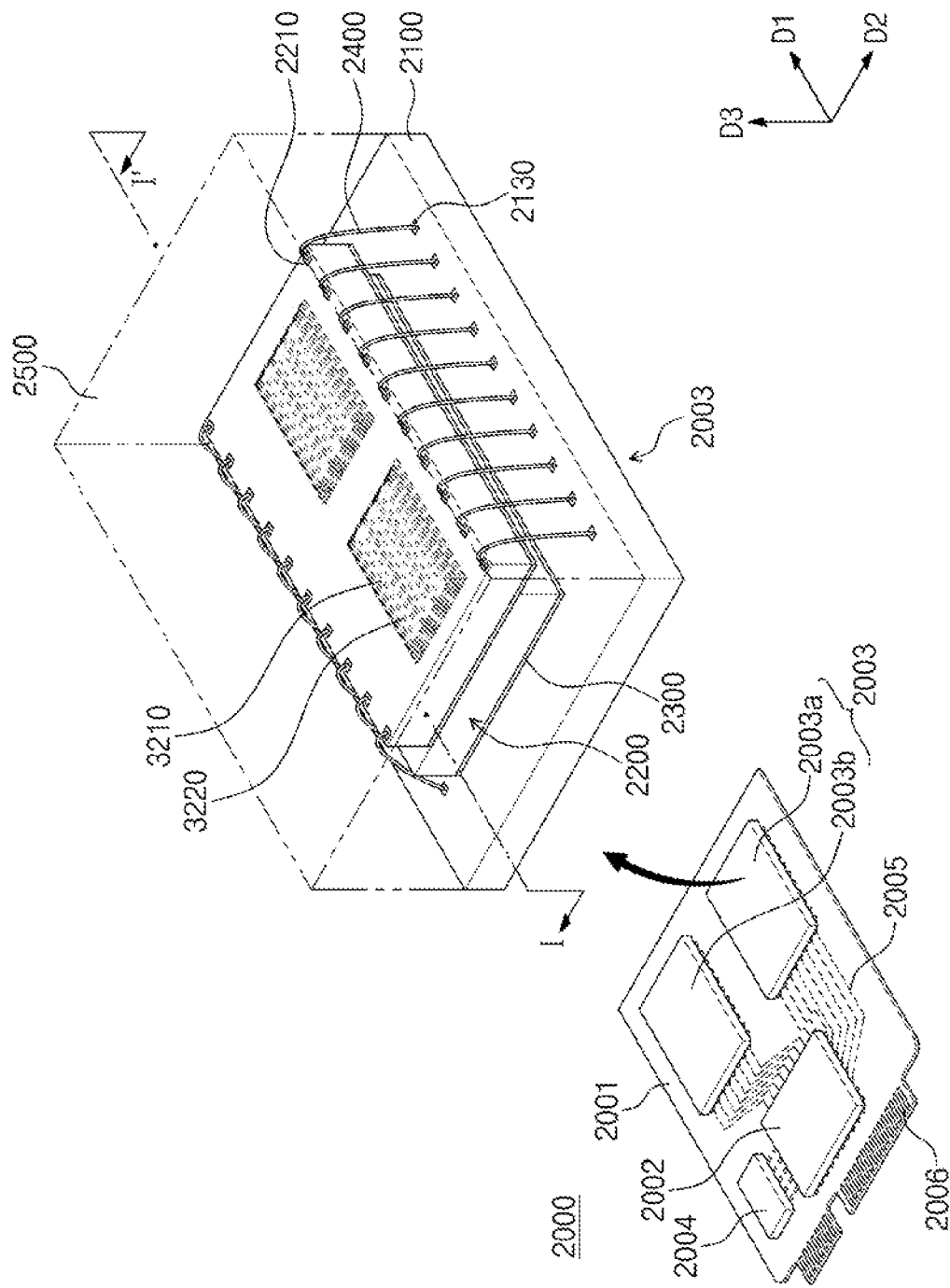
FIG. 11 illustrates a perspective view of an electronic system that includes a semiconductor device according to some example embodiments.

FIG. 11 illustrates a perspective view of an electronic system that includes a semiconductor device according to some example embodiments.

Referring to FIG. 11, an electronic system 2000 according to some example embodiments may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins which have connection with an external host. The number and arrangement of the plurality of pins on the connector 2006 may be changed based on a communication interface between the electronic system 2000 and the external host. In an implementation, the electronic system 2000 may communicate with the external host through one or more interfaces, e.g., universal serial bus (USB), peripheral component interconnect express (PIC-Express), serial advanced technology attachment (SATA), and/or M-PHY for universal flash storage (UFS). In an implementation, the electronic system 2000 may operate with power supplied through the connector 2006 from the external host. The electronic system 2000 may further include a power management integrated circuit (PMIC) that distributes the power supplied from the external host to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only a NAND controller for control of the semiconductor package 2003, but a DRAM controller for control of the DRAM 2004.

The semiconductor package 2003 may include a first semiconductor package 2003a and a second semiconductor package 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 on the package substrate 2100, adhesive layers 2300 on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be an integrated circuit board including package upper pads 2130. Each of the semiconductor chips 2200 may include one or more input/output pads 2210. The input/output pad 2210 may correspond to the input/output pad 1101 of FIG. 10. Each of the semiconductor chips 2200 may include gate stack structures 3210 and vertical structures 3220. Each of the semiconductor chips 2200 may include a semiconductor device which will be discussed below.

In an implementation, the connection structures 2400 may be bonding wires that electrically connect the input/output pads 2210 to the package upper pads 2130. Therefore, on each of the first and second semiconductor packages 2003a and 2003b, the semiconductor chips 2200 may be electrically connected to each other in a wire bonding manner, and may be electrically connected to the package upper pads 2130 of the package substrate 2100. In an implementation, on each of the first and second semiconductor packages 2003a and 2003b, the semiconductor chips 2200 may be electrically connected to each other using through-silicon vias instead of the connection structures 2400 or the bonding wires.

In an implementation, the controller 2002 and the semiconductor chips 2200 may be included in a single package. In an implementation, the controller 2002 and the semiconductor chips 2200 may be mounted on a separate interposer substrate other than the main board 2001, and may be connected to each other through wiring lines formed in the interposer substrate.

Figure 12:
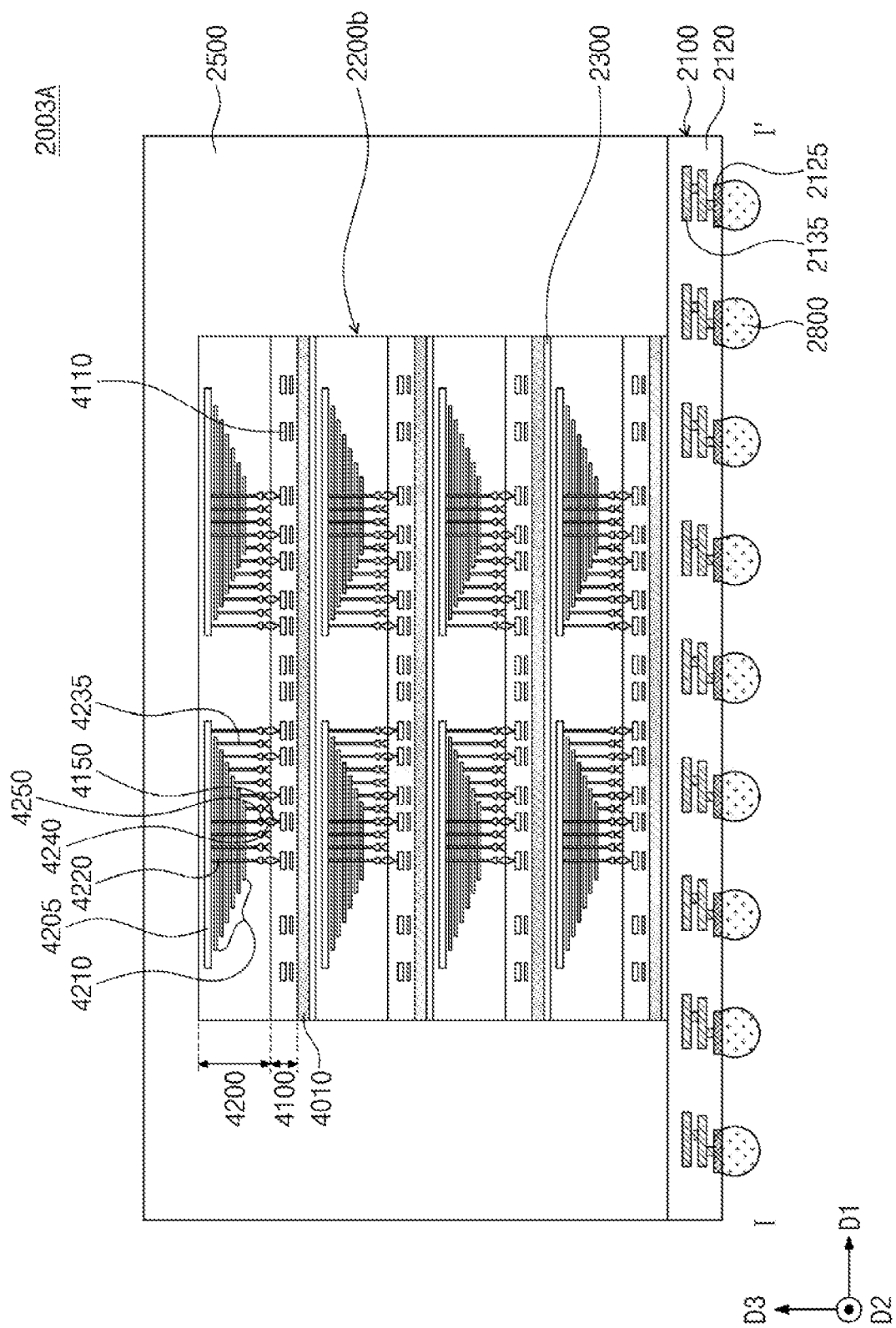
FIG. 12 illustrates a cross-sectional view of a semiconductor package according to some example embodiments.

FIG. 12 illustrates a cross-sectional view of a semiconductor package according to some example embodiments. FIG. 12 depicts an example of the semiconductor package illustrated in FIG. 11, conceptually showing a section taken along line I-I' of the semiconductor package illustrated in FIG. 11.

Referring to FIG. 12, on a semiconductor package 2003A, each of semiconductor chips 2200b may include a semiconductor substrate 4010, a first structure 4100 on the semiconductor substrate 4010, and a second structure 4200 on and coupled, using wafer bonding technology, to the first structure 4100.

The first structure 4100 may include a peripheral circuit region including peripheral wiring lines 4110 and first bonding structures 4150. The second structure 4200 may include a source structure 4205, a stack structure 4210 between the source structure 4205 and the first structure 4100, vertical structures 4220 and a separation structure that penetrate the stack structure 4210, and second bonding structures 4250 electrically connected to the vertical structures 4220 and word lines (see WL of FIG. 10) of the stack structure 4210. In an implementation, the second bonding structures 4250 may be electrically connected to the vertical structures 4220 through bit lines 4240 electrically connected to the vertical structures 4220 and also to the word lines WL through cell contact plugs 4235 electrically connected to the word lines WL. The first bonding structures 4150 of the first structure 4100 and the second bonding structures 4250 of the second structure 4200 may be coupled to each other while being in contact with each other. The first and second bonding structures 4150 and 4250 may have their bonding portions formed of copper (Cu).

Each of the first structure 4100, the second structure 4200, and the semiconductor chip 2200b may further include a source structure which will be discussed below. Each of the semiconductor chips 2200b may further include input/output pads (see 2210 of FIG. 11) electrically connected to the peripheral wiring lines 4110.

The semiconductor chips 2200b of FIG. 12 may be electrically connected to each other through connection structures each shaped like a bonding wire (see 2400 of FIG. 11). In an implementation, semiconductor chips, such as the semiconductor chips 2200b of FIG. 12, in a single semiconductor package may be electrically connected to each other through one or more connection structures including a through electrode.

The first structure 4100 of FIG. 12 may correspond to a peripheral circuit structure discussed in the following embodiments, and the second structure 4200 of FIG. 12 may correspond to a cell array structure discussed in the following embodiments.

Figure 13:
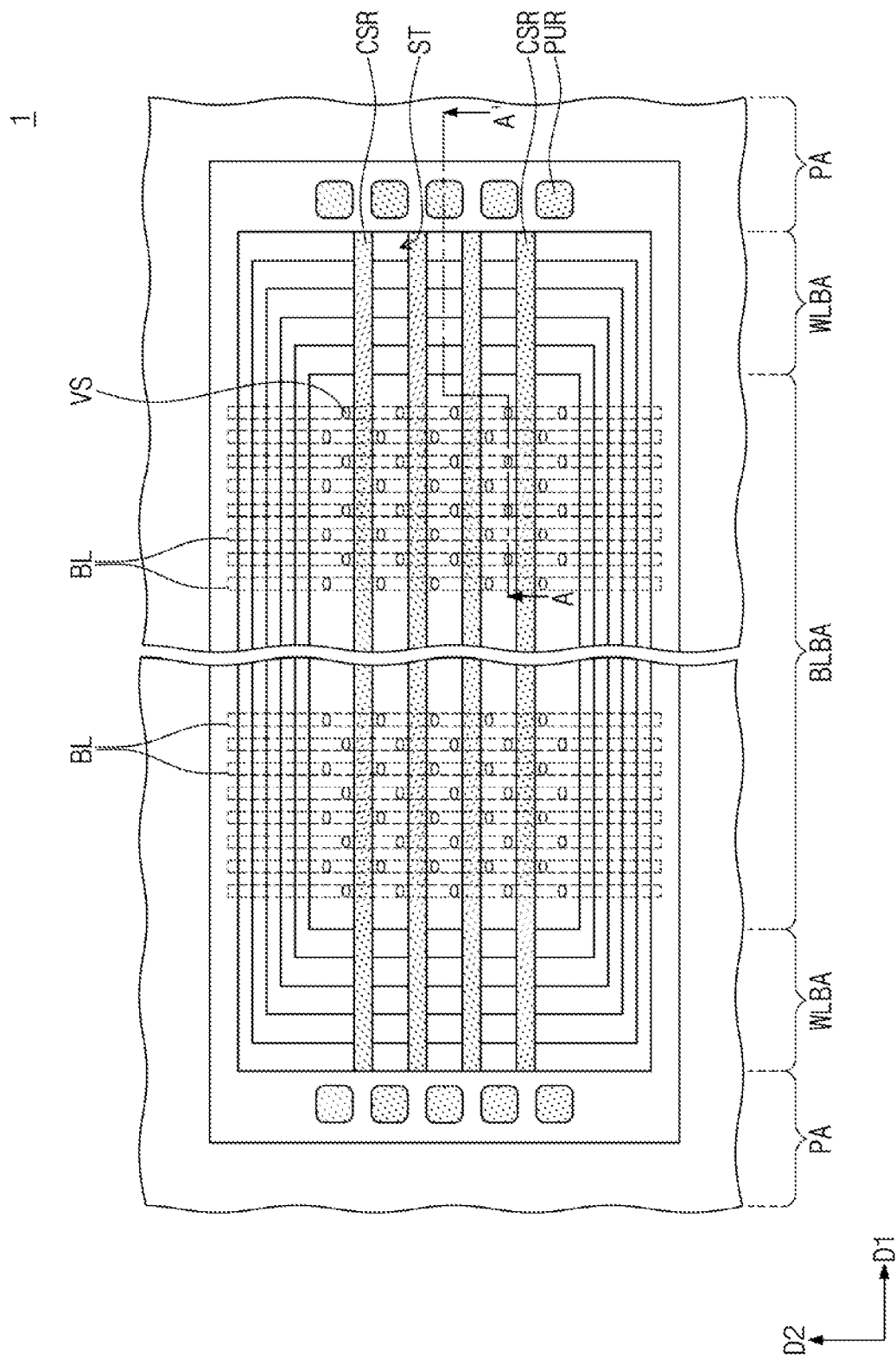
FIG. 13 illustrates a plan view of a semiconductor device according to some example embodiments.
Figure 14:
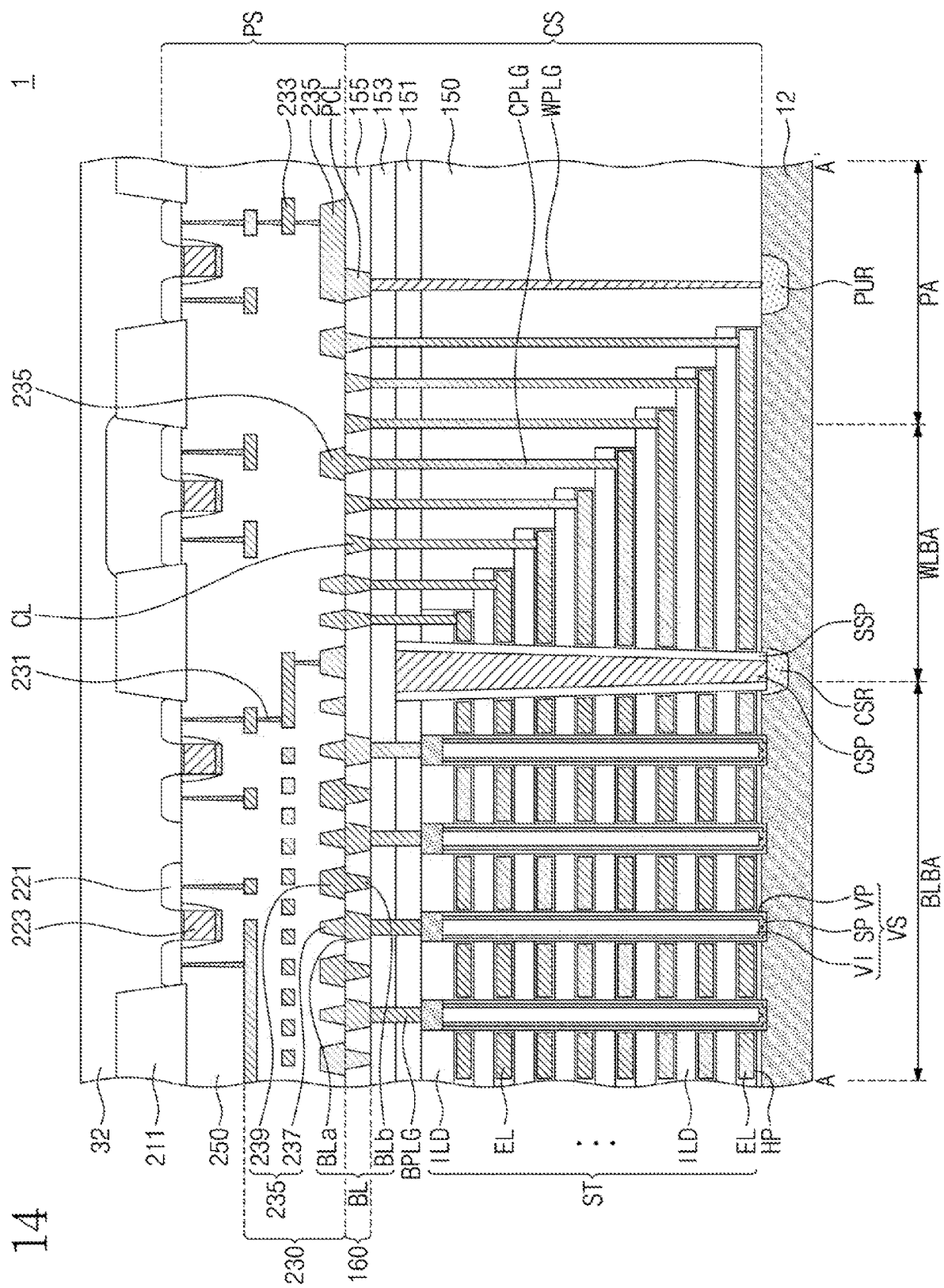
FIG. 14 illustrates a cross-sectional view taken along line A-A' of FIG. 13, of a semiconductor device according to some example embodiments.

FIG. 13 illustrates a plan view of a semiconductor device according to some example embodiments. FIG. 14 illustrates a cross-sectional view taken along line A-A' of FIG. 13, showing a semiconductor device according to some example embodiments.

Referring to FIGS. 13 and 14, a semiconductor device 1 may be a memory device. The semiconductor device 1 may have a chip-to-chip structure. The chip-to-chip structure may be fabricated by forming on a first wafer an upper chip including a cell array structure CS; forming, on a second wafer different from the first wafer, a lower chip including a peripheral circuit structure PS; and then using a bonding method to connect the upper and lower chips to each other. In an implementation, the bonding method may include electrically connecting a bonding metal formed on an uppermost metal layer of the upper chip to a bonding metal formed on an uppermost metal layer of the lower chip. When the bonding metal is formed of copper (Cu), the bonding method may be a Cu—Cu bonding method, and the bonding metal may also be formed of aluminum or tungsten.

Each of the cell array structure CS and the peripheral circuit structure PS of the semiconductor device 1 may include an external pad bonding area PA, a word-line bonding area WLBA, and a bit-line bonding area BLBA.

A first substrate 12 may be provided. The first substrate 12 may be formed of a semiconductor material, and may be a silicon (Si) substrate, a silicon-germanium (SiGe) substrate, a germanium (Ge) substrate, or a single-crystalline epitaxial layer grown on a single-crystalline silicon substrate. In an implementation, the first substrate 12 may be a silicon substrate. In an implementation, the first substrate 12 may include a semiconductor doped with impurities having a first conductivity type (e.g., p-type) and/or an intrinsic semiconductor doped with no impurity.

In an implementation, the cell array structure CS may be provided on the first substrate 12, and may include stack structures ST, vertical structures VS, and connection line structures CPLG, CL, WPLG, and PCL. In an implementation, the first substrate 12 and the cell array structure CS may correspond to the lower structure 10 discussed with reference to FIG. 1, and a portion of the cell array structure CS may correspond to the first circuit layer 14 of FIG. 1.

On the first substrate 12, the stack structures ST may extend lengthwise in parallel in a first direction D1 and may be arranged spaced apart from each other in a second direction D2. Each of the stack structures ST may include electrodes EL vertically stacked on the first substrate 12 and dielectric layers ILD between the electrodes EL. The dielectric layers ILD of the stack structures ST may have thicknesses that may be changed depending on characteristics of a semiconductor memory device. In an implementation, one or more of the dielectric layers ILD may be thicker than other ones of the dielectric layers ILD. The dielectric layers ILD may include silicon oxide (SiO). The electrodes EL may include a conductive material including, e.g., a semiconductor layer, a metal silicon layer, a metal layer, a metal nitride layer, or a combination thereof.

The stack structures ST may extend along the first direction D1 from the bit-line bonding area BLBA toward the word-line bonding area WLBL, and may have a stepwise structure on the word-line bonding area WLBA. The electrodes EL of the stack structures ST may have their lengths in the first direction D1 that decrease with increasing distance from the first substrate 12. The stack structures ST may have variously shaped stepwise structures on the word-line bonding area WLBA.

In an implementation, the semiconductor device 1 may be a three-dimensional NAND Flash memory device, and cell strings (see CSTR of FIG. 7) may be integrated on the first substrate 12. In this case, the stack structures ST may be configured such that uppermost and lowermost electrodes EL may be used as gate electrodes of selection transistors (see SST and GST of FIG. 7). In an implementation, the uppermost electrode EL may serve as a gate electrode of a string selection transistor (see SST of FIG. 7) that controls electrical connection between a bit line BL and the vertical structures VS, and the lowermost electrode EL may serve as a gate electrode of a ground selection transistor (see GST of FIG. 7) that controls electrical connection between a common source line (see CSL of FIG. 7) and the vertical structures VS. Other electrodes EL between the uppermost and lowermost electrodes EL may serve as control gate electrodes of memory cells and as word lines (see WL0 to WL3 of FIG. 7) that connect the control gate electrodes to each other.

On the bit-line bonding area BLBA, the vertical structures VS may penetrate the stack structures ST to come into contact with the first substrate 12. The vertical structures VS may be electrically connected to the first substrate 12. When viewed in a plan, the vertical structures VS may be arranged in a straight or zigzag fashion along one direction. In addition, on the word-line bonding area WLBA or the external pad bonding area PA, dummy vertical structures may be provided that have substantially the same structure as that of the vertical structures VS.

The vertical structures VS may include a semiconductor material, e.g., silicon (Si), germanium (Ge), or a mixture thereof. In an implementation, the vertical structures VS may include an impurity-doped semiconductor or an undoped intrinsic semiconductor. The vertical structures VS including a semiconductor material may serve as channels of the selection transistors SST and GST and the memory cell transistors MCT discussed with reference to FIG. 7. The vertical structures VS may have their bottom surfaces between top and bottom surfaces of the first substrate 12. The vertical structures VS may each be provided on its upper end with a contact pad coupled to a bit-line contact plugs BPLG.

Each of the vertical structures VS may include a vertical dielectric pattern VP and a semiconductor pattern SP in contact with the first substrate 12. The semiconductor pattern SP may have a hollow pipe (e.g., hollow cylindrical) shape or a macaroni shape. The semiconductor pattern SP may have a closed shape at a bottom end thereof, and a buried dielectric pattern VI may fill an inside of the semiconductor pattern SP. The semiconductor pattern SP may contact the top surface of the first substrate 12. The semiconductor pattern SP may be undoped or doped with impurities whose conductivity type is the same as that of the first substrate 12. The semiconductor pattern SP may be polycrystalline or single-crystalline.

The vertical dielectric pattern VP may be between the stack structure ST and the vertical structure VS. The vertical dielectric pattern VP may extend in a third direction D3 and surround a sidewall of the vertical structure VS. In an implementation, the vertical dielectric pattern VP may have a macaroni shape or a pipe shape whose top and bottom ends are opened.

The vertical dielectric pattern VP may be formed of a single thin layer or a plurality of thin layers. In an implementation, the vertical dielectric pattern VP may be a portion of a data storage layer. In an implementation, the vertical dielectric pattern VP may include a tunnel dielectric layer, a charge storage layer, and a blocking dielectric layer, which layers constitute a data storage layer of a NAND Flash memory device. In an implementation, the charge storage layer may be a trap dielectric layer, a floating gate electrode, or a dielectric layer including conductive nano-dots. In an implementation, the charge storage layer may include silicon nitride (SiN), silicon oxynitride (SiON), silicon-rich nitride, nano-crystalline silicon, or a laminated trap layer. The tunnel dielectric layer may be one of materials whose band gap is greater than that of the charge storage layer, and the blocking dielectric layer may be a high-k dielectric layer such as aluminum oxide ($Al_2O_3$) or hafnium oxide ($Hf_2O$). In an implementation, the vertical dielectric pattern VP may include a thin layer either for a phase change memory device or for a changeable resistance memory device.

A horizontal dielectric pattern HP may be between the vertical dielectric pattern VP and sidewalls of the electrodes EL. The horizontal dielectric pattern HP may extend onto top and bottom surfaces of the electrodes EL from the sidewalls of the electrodes EL. The horizontal dielectric pattern HP may include a charge storage layer and a blocking dielectric layer that are portions of a data storage layer of a NAND Flash memory device. In an implementation, the horizontal dielectric pattern HP may include a blocking dielectric layer.

Common source regions CSR may be in the first substrate 12 between neighboring stack structures ST. The common source regions CSR may extend lengthwise in the first direction D1 parallel to the stack structures ST. The common source regions CSR may be formed by doping the first substrate 12 with impurities having a second conductivity type. The common source regions CSR may include, e.g., n-type impurities (e.g., arsenic (As) or phosphorus (P)).

A common source plug CSP may be coupled to the common source region CSR. A sidewall dielectric spacer SSP may be interposed between the common source plug CSP and the stack structures ST. In a read or program mode of a three-dimensional NAND Flash memory device, a ground voltage may be applied through the common source plug CSP to the common source region CSR.

A first buried dielectric layer 150 may be on the first substrate 12, covering stepwise ends of the electrodes EL. A first interlayer dielectric layer 151 may cover top surfaces of the vertical structures VS, and may be provided thereon with a second interlayer dielectric layer 153 that covers a top surface of the common source plug CSP.

Bit lines BL may be on the second interlayer dielectric layer 153, and may extend lengthwise in the second direction D2 to thereby cross over the stack structures ST. Each of the bit lines BL may be electrically connected through the bit-line contact plug BPLG to the vertical structure VS. The bit lines BL may correspond to pads for electrical connection with the peripheral circuit structure PS which will be discussed below. The bit lines BL may have first sub-pads BLa and second sub-pads BLb. The first sub-pads BLa and the second sub-pads BLb may be identical or similar to the first sub-pads 22 and the second sub-pads 24 discussed with reference to FIG. 1. In an implementation, the first sub-pads BLa may have their widths greater than those of the second sub-pads BLb, and the first sub-pads BLa and the second sub-pads BLb may be alternately arranged in a direction parallel to the top surface of the first substrate 12.

The stepwise ends of the stack structures ST may be provided thereon with a connection line structure that electrically connects the cell array structure CS to the peripheral circuit structure PS. The connection line structure may include cell contact plugs CPLG that penetrate the first and second interlayer dielectric layers 151 and 153 and the first buried dielectric layer 150 to come into connection with corresponding ends of the electrodes EL, and may also include connection lines CL that are provided on the second interlayer dielectric layer 153 to come into connection with corresponding cell contact plugs CPLG. In an implementation, the connection line structure may include well contact plugs WPLG coupled to well pick-up regions PUR in the first substrate 12 and also include peripheral connection lines PCL connected to the well contact plugs WPLG.

The first substrate 12 may include the well pick-up regions PUR therein that are adjacent to opposite ends of each of the stack structures ST. The well pick-up regions PUR may have the same conductivity type as that of the first substrate 12 and an impurity concentration greater than that of the first substrate 12. In an implementation, the well pick-up regions PUR may include heavily doped p-type impurities (e.g., boron (B)). In an implementation, in an erase operation of a three-dimensional NAND Flash memory device, an erase voltage may be applied to the well pick-up regions PUR through the connection contact plugs PPLG and the well contact plugs WPLG.

The second interlayer dielectric layer 153 may be provided thereon with a third interlayer dielectric layer 155 that surrounds the bit lines BL, the connection lines CL, and the peripheral connection lines PCL. The third interlayer dielectric layer 155 may expose top surface of the bit lines BL, top surfaces of the connection lines CL, and top surfaces of the connection lines PCL. The bit lines BL, the connection lines CL, and the peripheral connection lines PCL may constitute a cell array wiring layer 160. The bit lines BL, the connection lines CL, and the peripheral connection lines PCL may correspond to pads of the cell array structures electrically connected to the peripheral circuit structure PS which will be discussed below.

As such, the cell array structure CS may be on the first substrate 12.

The peripheral circuit structure PS may be on the cell array structure CS.

A second substrate 32 may be provided. The second substrate 32 may be a silicon substrate, a silicon-germanium substrate, a germanium substrate, or a single-crystalline epitaxial layer grown on a single-crystalline silicon substrate. In an implementation, the second substrate 32 may be a silicon substrate having a first conductivity type (e.g., p-type), and may include well regions.

The peripheral circuit structure PS may include peripheral circuits that are integrated on an entire surface of the second substrate 32 and also include a second buried dielectric layer 250 that covers the peripheral circuits. In an implementation, the second substrate 32 and the peripheral circuit structure PS may correspond to the upper structure 30 discussed with reference to FIG. 1, and a portion of the peripheral circuit structure PS may correspond to the second circuit layer 34 of FIG. 1.

The peripheral circuits may be, as discussed above, row and column decoders, page buffers, and a control circuit, and may include NMOS and PMOS transistors, low-voltage and high-voltage transistors, and a resistor that are integrated on one surface of the second substrate 32. In an implementation, the peripheral circuits may include a free charge control circuit that controls a plurality of data program steps for a plurality of memory cells and that controls one or more of a plurality of cell strings.

In an implementation, the second substrate 32 may be provided therein with a device isolation layer 211 that defines active regions. Peripheral gate electrodes 223 may be disposed on the active regions of the second substrate 32, and gate dielectric layers may be interposed between the peripheral gate electrodes 223 and the second substrate 32.

Source/drain regions 221 may be provided in the second substrate 32 on opposite sides of each of the peripheral gate electrodes 223.

A peripheral circuit wiring layer 230 may be connected to the peripheral circuits on the second substrate 32. The peripheral circuit wiring layer 230 may include peripheral circuit lines 233 and peripheral circuit contact plugs 231. The peripheral circuit lines 233 may be electrically connected through the peripheral circuit contact plugs 231 to the peripheral circuits. In an implementation, the peripheral circuit contact plugs 231 and the peripheral circuit lines 233 may be coupled to the NMOS and PMOS transistors.

The second buried dielectric layer 250 may cover the peripheral gate electrodes 223, the peripheral circuit contact plugs 231, and the peripheral circuit lines 233. The peripheral circuit wiring layer 230 may further include exposure lines 235 exposed on a bottom surface of the second buried dielectric layer 250. The exposure lines 235 may correspond to pads for electrical connection of the peripheral circuit structure PS to the cell array structure CS. The exposure lines 235 may have third sub-pads 237 and fourth sub-pads 239. The third sub-pads 237 and the fourth sub-pads 239 may be identical or similar to the third sub-pads 42 and the fourth sub-pads 44 discussed with reference to FIG. 1. In an implementation, the third sub-pads 237 may have widths that are less than those of the fourth sub-pads 239, and the third sub-pads 237 and the fourth sub-pads 239 may be alternately arranged in a direction parallel to the top surface of the first substrate 12. The third sub-pads 237 may be at positions that correspond to those of the first sub-pads BLa, and the fourth sub-pads 239 may be at positions that correspond to those of the second sub-pads BLb. In an implementation, the third sub-pads 237 may be on the first sub-pads BLa, and the fourth sub-pads 239 may be on the second sub-pads BLb. The first sub-pads BLa may have widths that are greater than those of the third sub-pads 237, and the second sub-pads BLb may have widths that are less than those of the fourth sub-pads 239. The second buried dielectric layer 250 may include a plurality of stacked dielectric layers. In an implementation, the second buried dielectric layer 250 may include, e.g., silicon oxide (SiO), silicon nitride (SiN), silicon oxynitride (SiON), or low-k dielectric materials.

In an implementation, the peripheral circuit lines 233 and the peripheral circuit contact plugs 231 may be formed of tungsten whose resistance is relatively higher, and the exposure lines 235 may be formed of cupper whose resistance is relatively lower.

In an implementation, the peripheral circuit lines 233 may reside at a single level. In an implementation, the peripheral circuit lines 233 may be stacked at different levels. In this case, one or more of the peripheral circuit lines 233 may be formed of aluminum whose resistance is less than that of copper of which the exposure lines 235 are formed.

The cell array structure CS and the peripheral circuit structure PS may be in direct contact with each other. In an implementation, as shown in FIG. 14, the cell array wiring layer 160 of the cell array structure CS may be in contact with the peripheral circuit wiring layer 230 of the peripheral circuit structure PS. In an implementation, the third interlayer dielectric layer 155 may be in contact with the second buried dielectric layer 250, and the exposure lines 235 may be connected to the bit lines BL, the connection lines CL, and one or more of the peripheral connection lines PCL. In this case, the cell array wiring layer 160 and the peripheral circuit wiring layer 230 may constitute an intermetallic hybrid bonding. The exposure lines 235 may correspondingly have continuous configurations with the bit lines BL, the connection lines CL, and the peripheral connection lines PCL, and thus no boundary may be visually recognized between the exposure line 235 and each of the corresponding bit lines BL, the corresponding connection lines CL, and the corresponding peripheral connection lines PCL. For example, the first and third sub-pads BLa and 237 may be formed of the same material, and thus no interface may be present between the first sub-pads BLa and their corresponding third sub-pads 237. Thus, each of the first sub-pads BLa and its corresponding one of the third sub-pads 237 may be formed into a single body. In an implementation, the second and fourth sub-pads BLb and 239 may be formed of the same material, and no interface may be present between the second sub-pads BLb and their corresponding fourth sub-pads 239. Thus, each of the second sub-pads BLb and its corresponding one of the fourth sub-pads 239 may be formed into a single body.

In an implementation, on the word-line bonding area WLBA whose line density is higher, the first sub-pads BLa whose areas are larger may be arranged alternately with the second sub-pads BLb whose areas are smaller. Therefore, a wide spacing may be provided between the first and second sub-pads BLa and BLb, and a short-circuit may be prevented between the first and second sub-pads BLa and BLb, with result that the bit line BL may have high degree of routing freedom.

Figure 15:
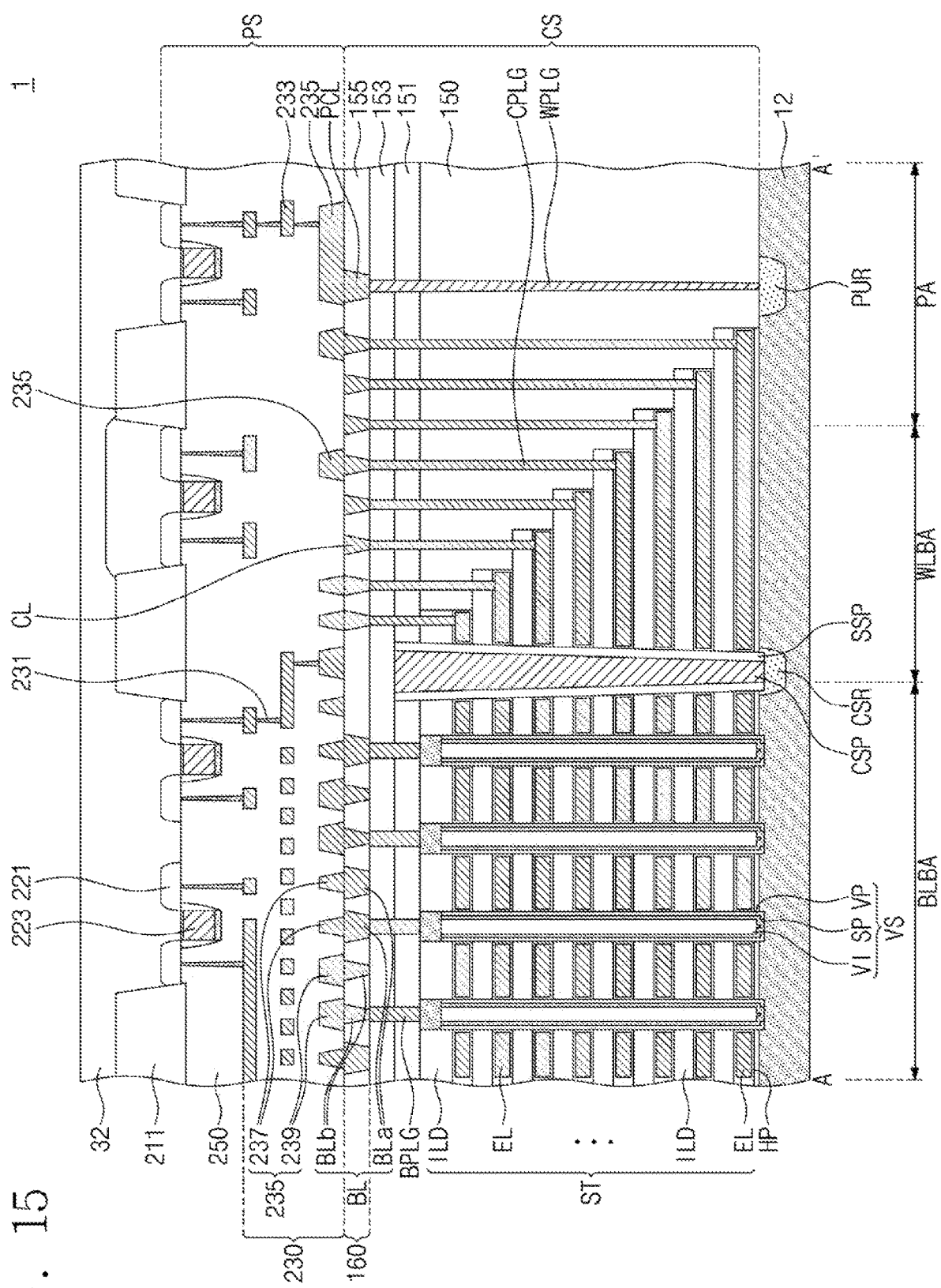
FIG. 15 illustrates a cross-sectional view of a semiconductor device according to some example embodiments.

In an implementation, as illustrated in FIG. 14, the first sub-pads BLa and the second sub-pads BLb may be alternately arranged, and that the third sub-pads 237 and the fourth sub-pads 239 may be alternately arranged. FIG. 15 illustrates a cross-sectional view showing a semiconductor device according to some example embodiments. As shown in FIG. 15, the bit lines BL may be in groups each including at least two first sub-pads BLa or at least two second sub-pads BLb, and the groups may be adjacent to each other. The third sub-pads 237 may be at positions that correspond to those of the first sub-pads BLa, and the fourth sub-pads 239 may be at positions that corresponding to those of the second sub-pads BLb. The exposure lines 235 may be in groups each including at least two third sub-pads 237 or at least two fourth sub-pads 239, and the groups may be adjacent to each other.

The cell array wiring layer 160 and the peripheral circuit wiring layer 230 may constitute an intermetallic hybrid bonding. The exposure lines 235 may correspondingly have continuous configurations with the bit lines BL, the connection lines CL, and the peripheral connection lines PCL, and thus no boundary may be visually recognized between the exposure line 235 and each of the corresponding bit lines BL, the corresponding connection lines CL, and the corresponding peripheral connection lines PCL. In an implementation, the first and third sub-pads BLa and 237 may be formed of the same material, and no interface may be present between the first sub-pads BLa and their corresponding third sub-pads 237. Thus, each of the first sub-pads BLa and its corresponding one of the third sub-pads 237 may be formed into a single body. In an implementation, the second and fourth sub-pads BLb and 239 may be formed of the same material, and no interface may be present between the second sub-pads BLb and their corresponding fourth sub-pads 239. Thus, each of the second sub-pads BLb and its corresponding one of the fourth sub-pads 239 may be formed into a single body.

Figure 16:
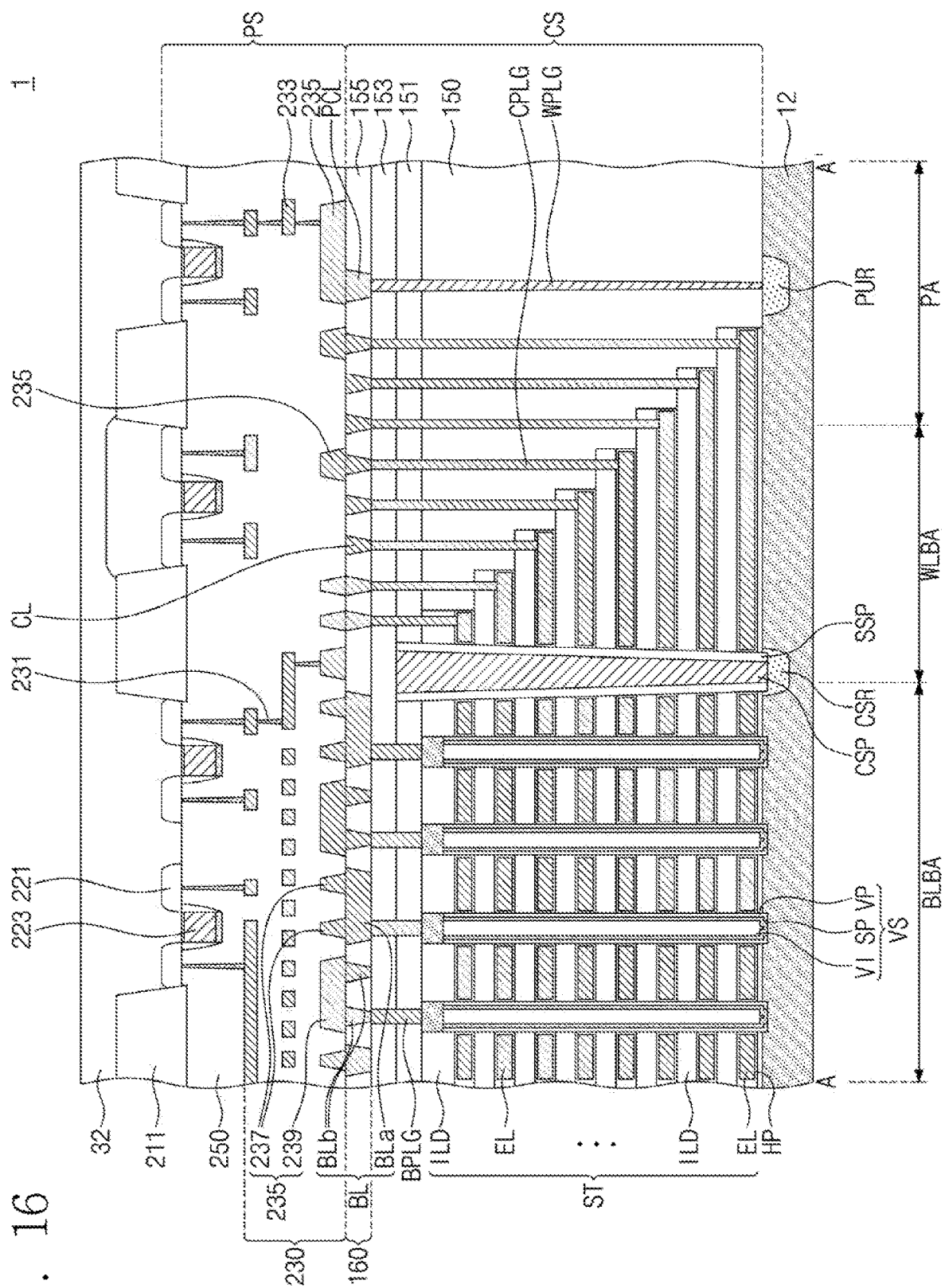
FIG. 16 illustrates a cross-sectional view of a semiconductor device according to some example embodiments.

FIG. 16 illustrates a cross-sectional view of a semiconductor device according to some example embodiments.

As shown in FIG. 16, the bit lines BL may include first sub-pads BLa and second sub-pads BLb. At least two third sub-pads 237 may be coupled to a single first sub-pad BLa, and at least two second sub-pads BLb may be coupled to a single fourth sub-pad 239.

At least two second sub-pads BLb may be between neighboring first sub-pads BLa. The first sub-pads BLa may have widths greater than those of the second sub-pads BLb.

At least two third sub-pads 237 may be between neighboring fourth sub-pads 239. The fourth sub-pads 239 may have widths greater than those of the third sub-pads 237.

In this case, the third sub-pads 237 between neighboring fourth sub-pads 239 may be aligned with one of the first sub-pads BLa, and the second sub-pads BLb between the first sub-pads BLa may be aligned with one of the fourth sub-pads 239. In an implementation, at least two third sub-pads 237 may be positioned on a single first sub-pad BLa, and at least two second sub-pads BLb may be positioned on a single fourth sub-pad 239.

The cell array wiring layer 160 and the peripheral circuit wiring layer 230 may constitute an intermetallic hybrid bonding. The exposure lines 235 may correspondingly have continuous configurations with the bit lines BL, the connection lines CL, and the peripheral connection lines PCL, and thus no boundary may be visually recognized between the exposure line 235 and each of the corresponding bit lines BL, the corresponding connection lines CL, and the corresponding peripheral connection lines PCL. In such a case, one of the first sub-pads BLa may be coupled to at least two third sub-pads 237, and one of the fourth sub-pads 239 may be coupled to at least two second sub-pads BLb. The first sub-pads BLa may have their widths greater than those of the third sub-pads 237. In an implementation, the width of each of the first sub-pads BLa may be about 2 to 10 times the width of each of the third sub-pads 237. The second sub-pads BLb may have widths less than those of the fourth sub-pads 239. In an implementation, the width of the fourth sub-pads 239 may be about 2 to 10 times the width of each of the second sub-pads BLb.

Figure 23:
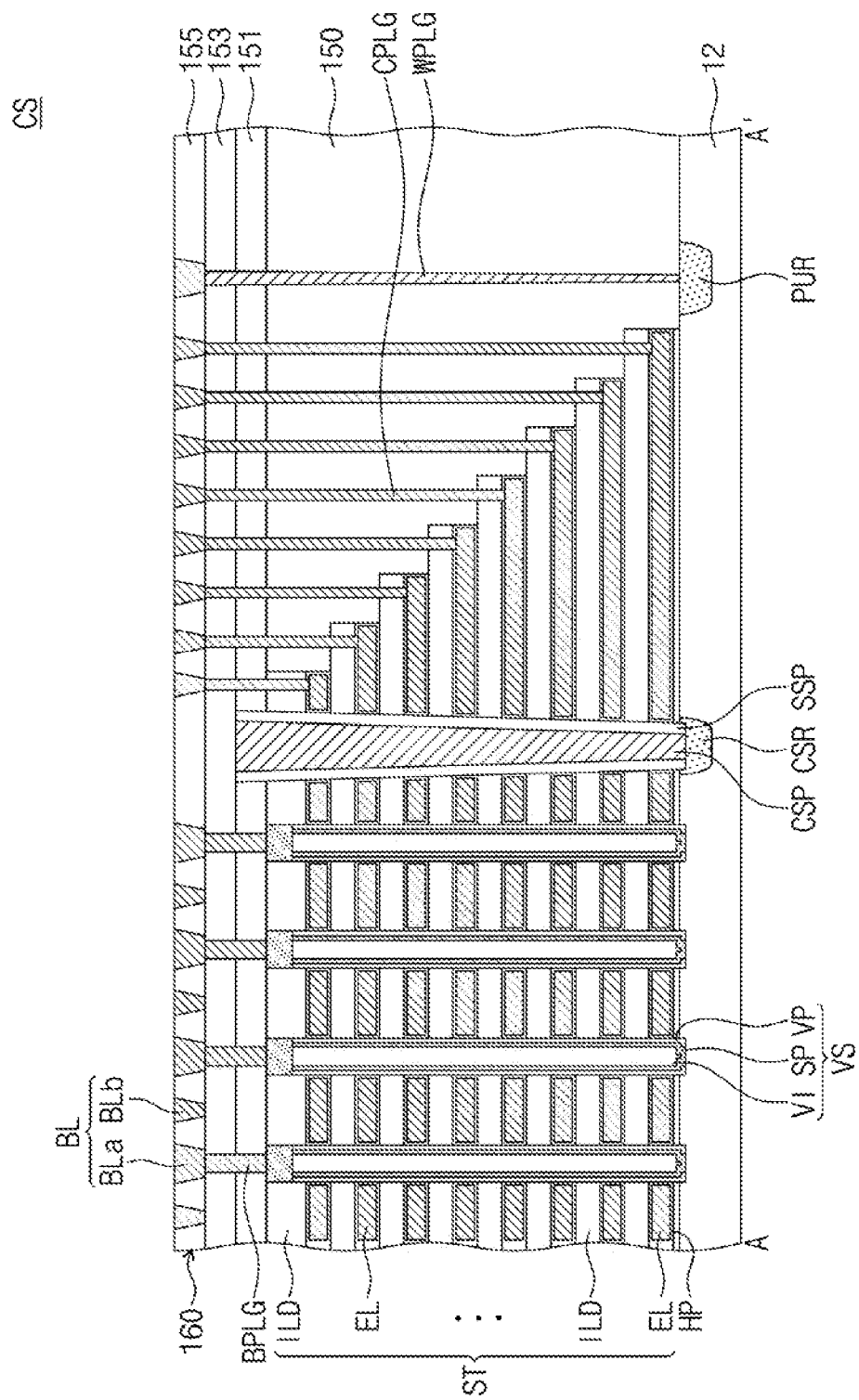
Figure 24:
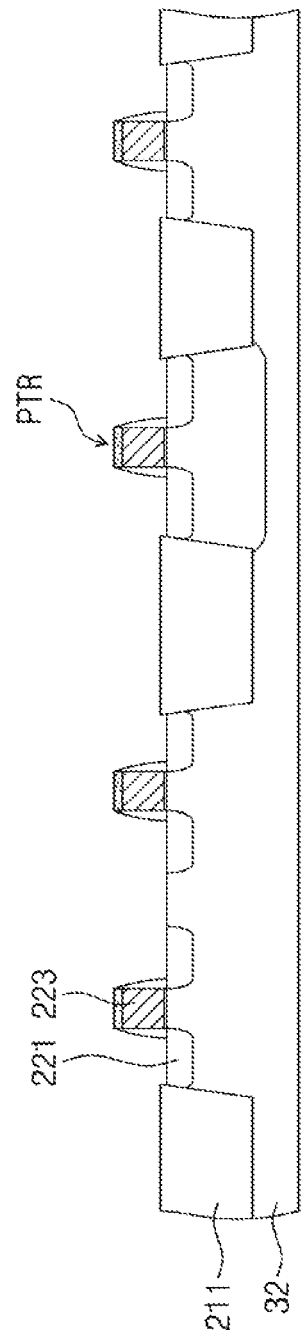
Figure 25:
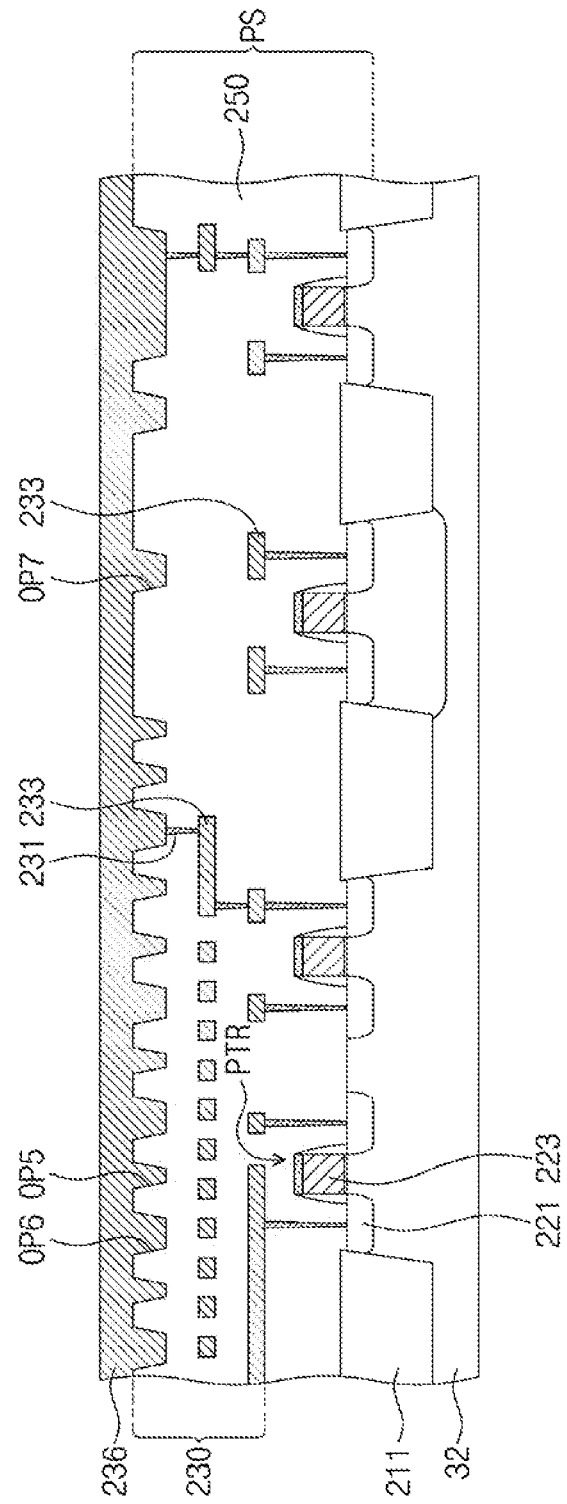
Figure 26:
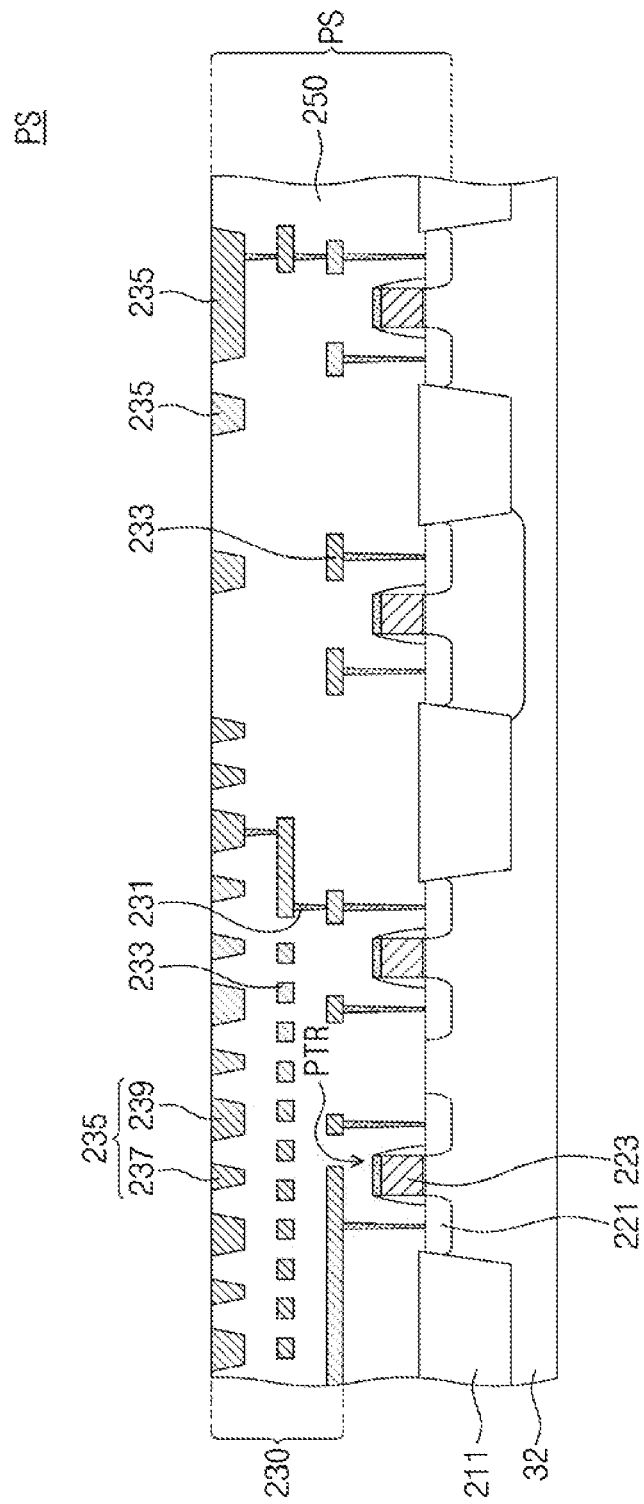
Figure 27:
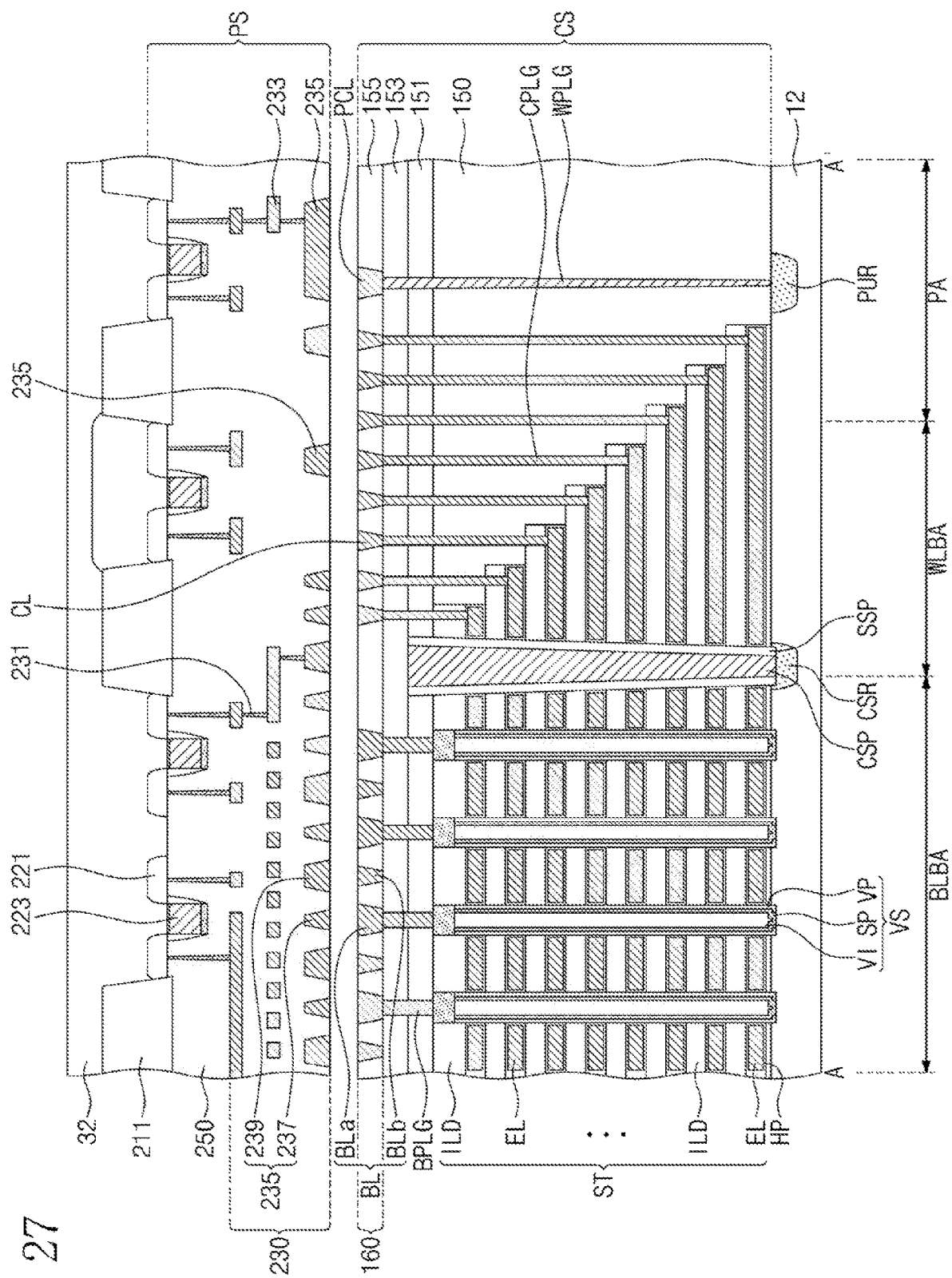

FIGS. 17 to 27 illustrate cross-sectional views of stages in a method of fabricating a semiconductor device according to some example embodiments. FIGS. 17 to 24 show the formation of a cell array structure, and FIGS. 25 to 27 show the formation of a peripheral circuit structure.

Figure 17:
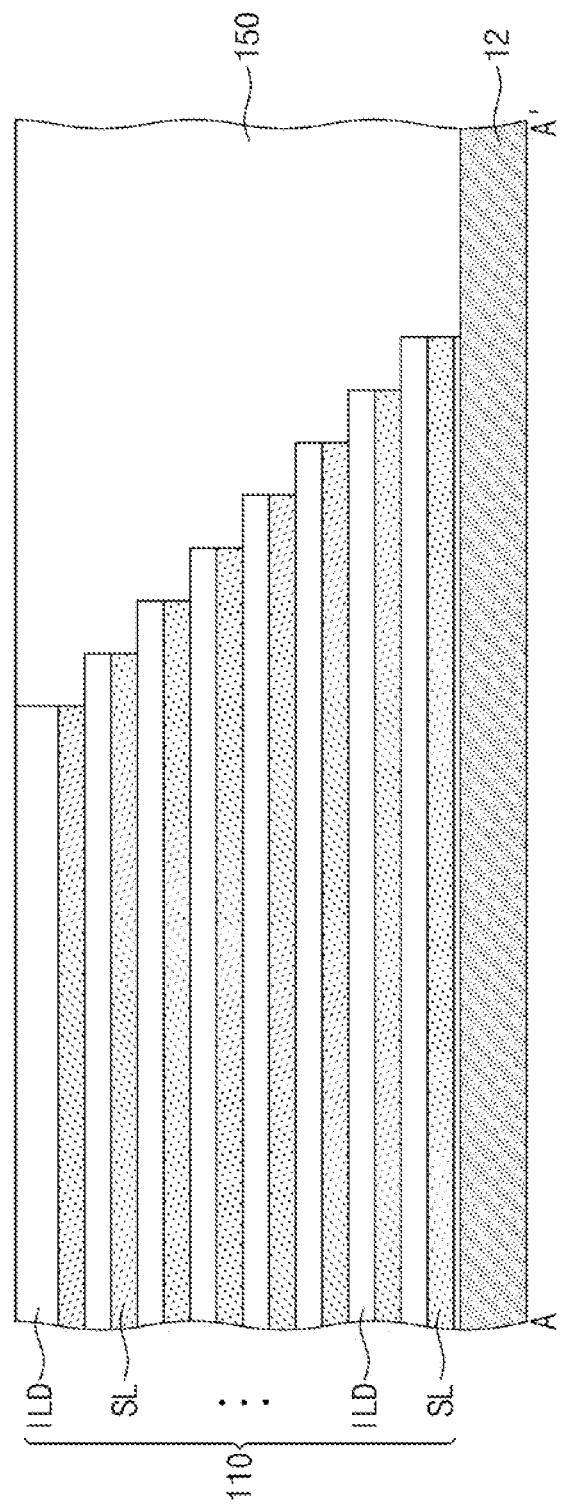
FIGS. 17 to 27 illustrate cross-sectional views of stages in a method of fabricating a semiconductor device according to some example embodiments.

Referring to FIGS. 13 and 17, a first substrate 12 may be prepared which includes chip regions and a scribe line region, as discussed with reference to FIG. 5. In an implementation, the first substrate 12 may be a semiconductor substrate having a first conductivity type (e.g., p-type). The first substrate 12 may be a single-crystalline silicon substrate.

A thin-layer structure may be formed on the first substrate 12. The thin-layer structure may be formed to cover an entire surface of the first substrate 12. The thin-layer structure may include sacrificial layers SL and dielectric layers ILD that are alternately and repeatedly stacked. The sacrificial layers SL of the thin-layer structure may have the same thickness. The sacrificial layers SL and the dielectric layers ILD may be formed by using thermal chemical vapor deposition (CVD), plasma-enhanced CVD, or atomic layer deposition (ALD). The sacrificial layers SL may be formed of a material that can be etched with an etch selectivity with respect to the dielectric layers ILD. For example, the sacrificial layers SL and the dielectric layers ILD may have a high etch selectivity with respect to a chemical solution for wet etching and a low etch selectivity with respect to an etching gas for dry etching. In an implementation, the sacrificial layers SL and the dielectric layers ILD may be formed of dielectric materials one of which has an etch selectivity different from that of the other. In an implementation, the sacrificial layers SL may be formed of silicon nitride (SiN), and the dielectric layers ILD may be formed of silicon oxide (SiO).

Then, the thin-layer structure may undergo a patterning process to form a mold structure 110 on the first substrate 12. The mold structure 110 may be formed by performing a trimming process on the thin-layer structure. The trimming process may include forming a mask pattern on the thin-layer structure, etching a portion of the thin-layer structure, reducing a horizontal area of the mask pattern, and alternately and repeatedly performing the etching and reducing steps. The trimming process may cause the mold structure 110 to have a stepwise structure on an edge of the first substrate 12.

A first buried dielectric layer 150 may be formed on the first substrate 12 on which the mold structure 110 is formed. The first buried dielectric layer 150 may be formed by deposing a thick dielectric layer to cover the mold structure 110 and then performing a planarization process on the dielectric layer. The first buried dielectric layer 150 may be formed of a dielectric material having an etch selectivity with respect to the sacrificial layers SL.

Figure 18:
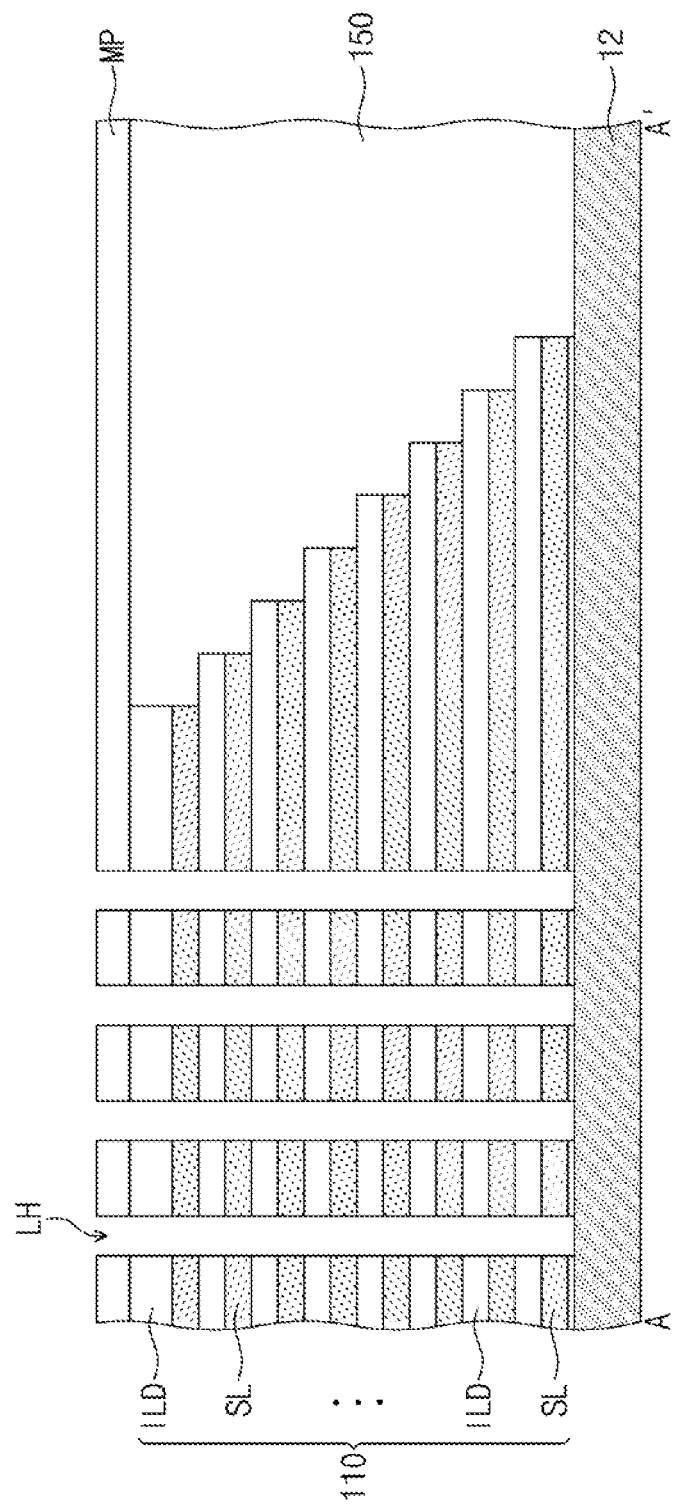

Referring to FIGS. 13 and 18, a hardmask layer MP may be formed to have openings that expose portions of the mold structure 110. The hardmask layer MP may include a silicon-containing material such as silicon oxide (SiO), silicon nitride (SiN), silicon oxynitride (SiON), or polysilicon; a carbon-containing material such as an amorphous carbon layer (ACL) or a spin-on-hardmask (SOH) layer; a metallic material such as tungsten; or an organic material. The hardmask layer MP may be formed to cover the entire surface of the first substrate 12.

An anisotropic etching process may be performed on the portions of the mold structure 110 that are exposed to the openings of the hardmask layer MP to form on the mold structure 110 a plurality of vertical holes LH that expose the first substrate 12. When viewed in a plan view, the vertical holes LH may be arranged along one direction or arrayed in a zigzag fashion. The anisotropic etching process on the mold structure 110 may be a plasma etching process, a reactive ion etching (RIE) process, a radio-frequency inductively coupled plasma reactive ion etching (ICP-RIE) process, or an ion beam etching (IBE) process.

Figure 19:
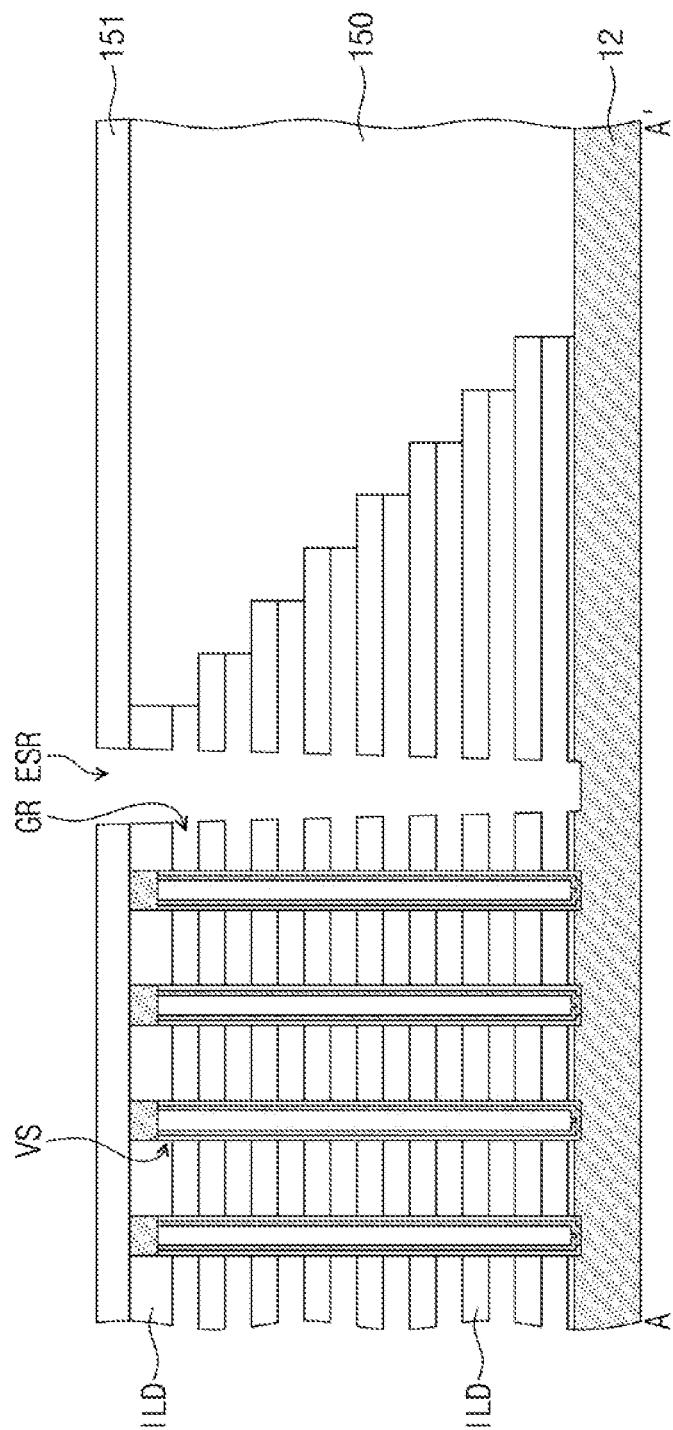

Referring to FIGS. 13 and 19, vertical structures VS may be formed in the vertical holes (see LH of FIG. 18). As discussed above, the vertical structures VS may include a semiconductor material or a conductive material.

The formation of the vertical structures VS may include forming a semiconductor spacer to expose the first substrate 12 and to cover sidewalls of the vertical holes LH, and then forming a semiconductor body connected to the first substrate 12. The vertical structures VS may include silicon (Si), germanium (Ge), or a mixture thereof, and may be an impurity-doped semiconductor or an impurity-undoped intrinsic semiconductor. The vertical structures VS may be connected to the first substrate 12. In addition, the vertical structure VS may have a conductive pad on a top end thereof. The conductive pad may be an impurity-doped region or may be formed of a conductive material.

In an implementation, before the vertical structures VS are formed in the vertical holes LH, as discussed with reference to FIG. 14, a vertical dielectric pattern VP may be formed in the vertical holes LH. The vertical dielectric pattern VP may be formed of a single thin layer or a plurality of thin layers. The vertical dielectric pattern VP may be a portion of a data storage layer.

After the vertical structures VS are formed, conductive layers may replace the sacrificial layers SL of the mold structure 110 such that stack structures ST may be formed to include electrodes (see EL of FIG. 20) that are vertically stacked on the first substrate 12. This will be described in detail with reference to FIGS. 19 and 20.

Referring again to FIGS. 13 and 19, a first interlayer dielectric layer 151 may be formed on the first buried dielectric layer 150, covering top surfaces of the vertical structures VS. After the formation of the first interlayer dielectric layer 151, electrode separation regions ESR may be formed to penetrate the mold structure (see 110 of FIG. 18) and to expose the first substrate 12. The electrode separation regions ESR may be formed by anisotropically etching the mold structure 110, and may expose sidewalls of the mold structure 110.

The electrode separation regions ESR may extend along a first direction D1 from a word-line bonding area WLBA toward a bit-line bonding area BLBA. At least one of the electrode separation regions ESR may have a length in the first direction D1 less than those of other ones of the electrode separation regions ESR. The formation of the electrode separation regions ESR may form a plurality of sub-mold structures that are spaced apart from each other in a second direction D2.

The sacrificial layers SL exposed to the electrode separation regions ESR may be removed to form gate regions GR. The gate regions GR may be formed when the sacrificial layers SL are isotropically etched using an etch recipe that has an etch selectivity with respect to the dielectric layers ILD, the vertical structures VS, and the first substrate 12. The isotropic etching process may completely remove the sacrificial layers SL. In an implementation, when the sacrificial layers SL include silicon nitride (SiN) and the dielectric layers ILD include silicon oxide (SiO), the isotropic etching process may be performed using an etchant that includes phosphoric acid. When the gate regions GR are formed, the vertical structures VS may prevent collapse of the dielectric layers ILD that define the gate regions GR.

The gate regions GR may be empty spaces between the dielectric layers ILD that are vertically adjacent to each other, and may partially expose the sidewalls of the vertical structures VS. The gate regions GR may also expose sidewalls of the first buried dielectric layer 150.

Figure 20:
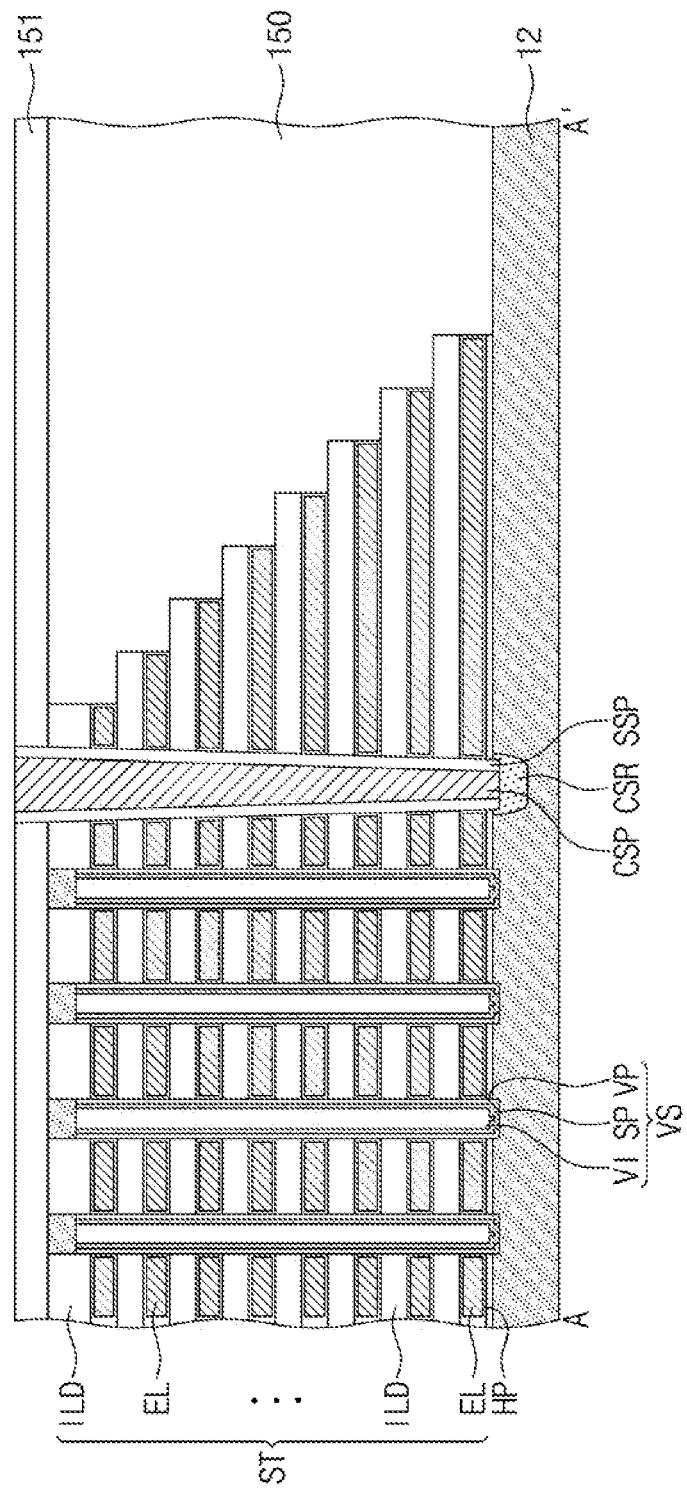

Referring to FIGS. 13 and 20, horizontal dielectric patterns HP and electrodes EL may be formed in the gate regions GR, such that a stack structure ST may be formed on the first substrate 12.

In an implementation, the horizontal dielectric patterns HP and the electrodes EL may be formed by sequentially depositing a horizontal dielectric layer, a barrier metal layer (e.g., TiN, TaN, or WN), and a metal layer (e.g., W) on the mold structure (see 110 of FIG. 18) in which the gate regions GR are formed, and then anisotropically etching the horizontal dielectric layer and the metal layer that are deposited on inner walls of the electrode separation regions ESR. The horizontal dielectric pattern HP may include one or more of silicon oxide (SiO) and a high-k dielectric material, which serve as a portion of a data storage layer of a NAND Flash memory device.

After the formation of the electrodes EL, common source regions CSR may be formed in the first substrate 12 exposed to the electrode separation regions ESR, and the electrode separation regions ESR may be filled with a dielectric material. The common source regions CSR may include, e.g., n-type impurities (e.g., arsenic (As) or phosphorus (P)). A common source plug CSP may be formed in the electrode separation region ESR to come into contact with the common source region CSR.

Figure 21:
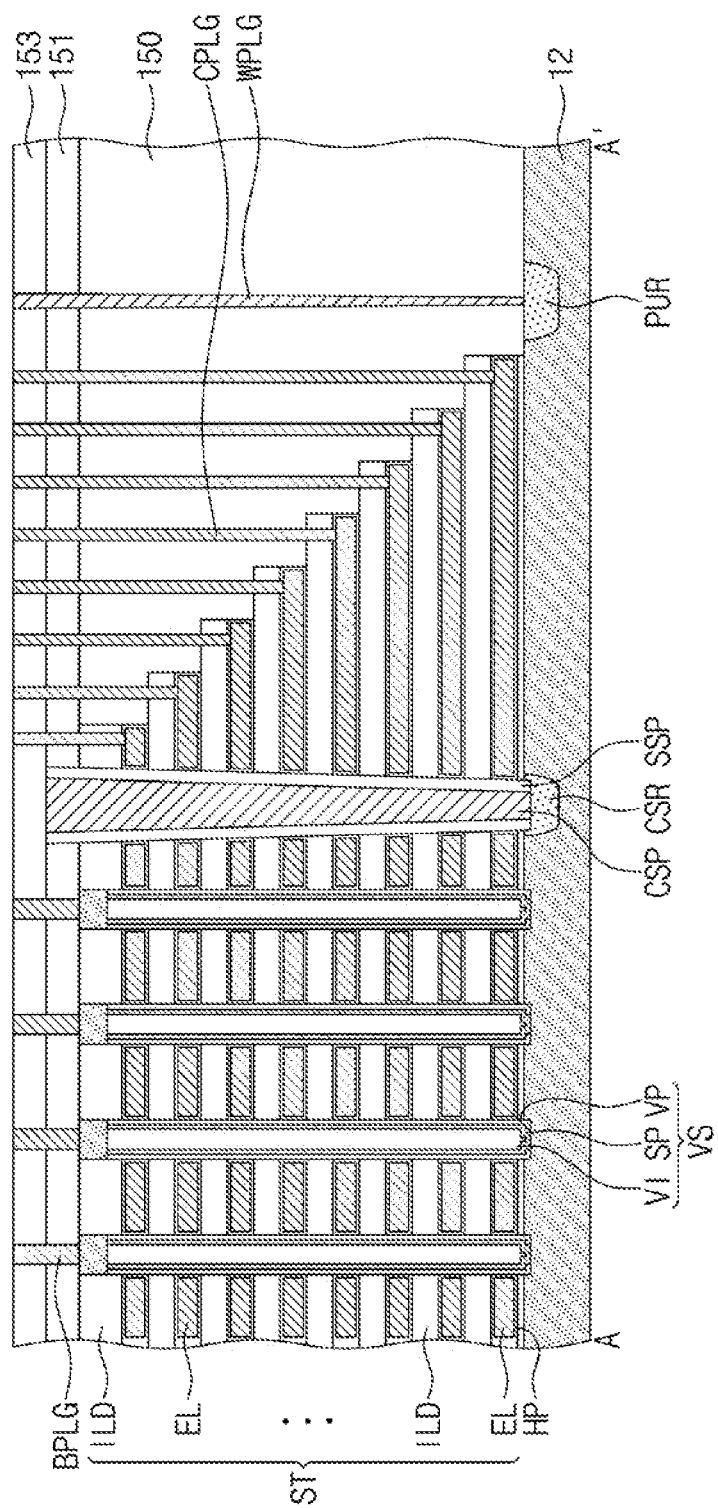

Referring to FIGS. 13 and 21, a second interlayer dielectric layer 153 may be formed on the first interlayer dielectric layer 151. Thereafter, the second interlayer dielectric layer 153, the first interlayer dielectric layer 151, and the first buried dielectric layer 150 may undergo a patterning process to form contact holes. In an implementation, cell contact holes may be formed to expose corresponding ends of the electrodes EL on the word-line bonding area WLBA. Connection contact holes may be formed on an external pad bonding area PA, exposing the first substrate 12. Bit-line contact holes may be formed to expose the vertical structures VS on the bit-line bonding area BLBA.

Then, the contact holes may be filled with a conductive material to form bit-line contact plugs BPLG, cell contact plugs CPLG, and well contact plugs WPLG, as discussed with reference to FIG. 14.

Figure 22:
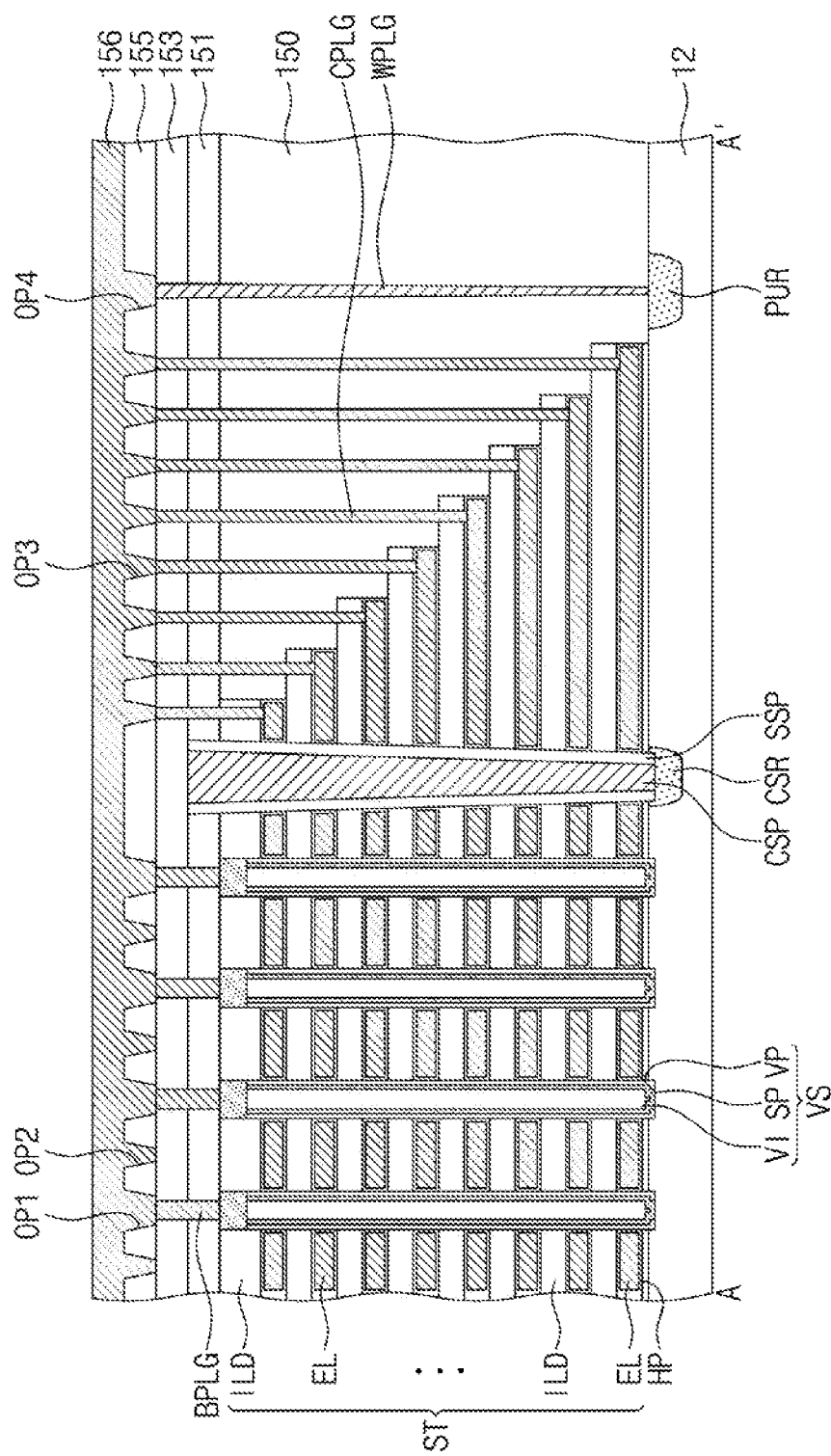

Referring to FIGS. 13 and 22, a third interlayer dielectric layer 155 may be formed on the second interlayer dielectric layer 153. On the second interlayer dielectric layer 153, the third interlayer dielectric layer 155 may cover the bit-line contact plugs BPLG, the cell contact plugs CPLG, and the well contact plugs WPLG. After that, the third interlayer dielectric layer 155 may undergo a patterning process to form openings. In an implementation, first openings OP1 and second openings OP2 may be formed on the bit-line bonding area BLBA. One or more of the first and second openings OP1 and OP2 may expose the bit-line contact plugs BPLG. Third openings OP3 may be formed to expose the cell contact plugs CPLG on the word-line bonding area WLBA. Fourth openings OP4 may be formed to expose the well contact plugs WPLG on the external pad bonding area PA. One among the first, second, third, and fourth openings OP1, OP2, OP3, and OP4 may have a width greater than those of others among the first, second, third, and fourth openings OP1, OP2, OP3, and OP4. In an implementation, the first openings OP1 may have their widths greater than those of the second openings OP2. In this case, the first openings OP1 and the second openings OP2 may be alternately arranged.

A first conductive layer 156 may be formed on the third interlayer dielectric layer 155. The first conductive layer 156 may cover the third interlayer dielectric layer 155, and may fill the first, second, third, and fourth openings OP1, OP2, OP3, and OP4. The first conductive layer 156 may include copper (Cu).

Referring to FIGS. 13 and 23, the first conductive layer 156 may undergo a planarization process to form bit lines BL, connection lines CL, and peripheral connection lines PCL. The planarization process may include, e.g., a chemical mechanical polishing (CMP) process. The planarization process may be performed until a top surface of the third interlayer dielectric layer 155 is exposed. Therefore, the bit lines BL may be formed to fill the first openings OP1 and the second openings OP2, the connection lines CL may be formed to fill the third openings OP3, and the peripheral connection lines PCL may be formed to fill the fourth openings OP4. The bit lines BL, the connection lines CL, and the peripheral connection lines PCL may constitute a cell array wiring layer 160. The bit lines BL, the connection lines CL, and the peripheral connection lines PCL may have their top surfaces coplanar with that of the third interlayer dielectric layer 155. The bit lines BL may include first sub-pads BLa in the first openings OP1 and second sub-pads BLb in the second openings OP2. The first sub-pads BLa may have their widths greater than those of the second sub-pads BLb.

Through the processes mentioned above, a cell array structure CS may be formed.

Referring to FIGS. 13 and 24, a second substrate 32 may be prepared which includes chip regions and a scribe line region, as discussed with reference to FIG. 5. In an implementation, the second substrate 32 may be a semiconductor substrate having a first conductivity type (e.g., p-type).

Peripheral circuits PTR may be formed on each of the chip regions of the second substrate 32. The peripheral circuits PTR may include, e.g., high-voltage and low-voltage transistors. The formation of the peripheral circuits PTR may include sequentially forming a peripheral gate dielectric layer and a peripheral gate electrode 223 on the second substrate 32, and then forming source/drain regions 221 by implanting impurities into the second substrate 32 on opposite sides of the peripheral gate electrode 223.

A peripheral gate spacer may be formed on a sidewall of the peripheral gate electrode 223.

Referring to FIGS. 13 and 25, peripheral wiring structures of a peripheral circuit wiring layer 230 may be formed to have connections with the peripheral circuits PTR, which wiring structures may include peripheral circuit contact plugs 231 and peripheral circuit lines 233. In an implementation, row and column decoders, page buffers, and control circuits may be formed on each of the chip regions of the second substrate 32.

After the formation of the peripheral circuits PTR and the peripheral wiring structures, a second buried dielectric layer 250 may be formed to cover an entire surface of the second substrate 32. In this case, the peripheral circuit lines 233 may be buried in the second buried dielectric layer 250. The second buried dielectric layer 250 may include a single dielectric layer or a plurality of stacked dielectric layers including, e.g., silicon oxide (SiO), silicon nitride (SiN), silicon oxynitride (SiON), or a low-k dielectric material. Afterwards, the second buried dielectric layer 250 may undergo a patterning process to form openings. In an implementation, fifth openings OP5 and sixth openings OP2 may be formed on the bit-line bonding area BLBA. Seventh openings OP7 may be formed on the word-line bonding area WLBA and the external pad bonding area PA. Each of the fifth, sixth, and seventh openings OP5, OP6, and OP7 may expose the peripheral circuit contact plug 231 or the peripheral circuit line 233. One among the fifth, sixth, and seventh openings OP5, OP6, and OP7 may have a width greater than those of others among the fifth, sixth, and seventh openings OP5, OP6, and OP7. In an implementation, the sixth openings OP6 may have their widths greater than those of the fifth openings OP5. In this case, the fifth openings OP5 and the sixth openings OP6 may be alternately arranged.

A second conductive layer 236 may be formed on the second buried dielectric layer 250. The second conductive layer 236 may cover the second buried dielectric layer 250, and may fill the fifth, sixth, and seventh openings OP5, OP6, and OP7. The second conductive layer 236 may include copper (Cu).

Referring to FIGS. 13 and 26, the second conductive layer 236 may undergo a planarization process to form exposure lines 235. The planarization process may include, for example, a chemical mechanical polishing (CMP) process. The planarization process may be performed until a top surface of the second buried dielectric layer 250. Therefore, the exposure lines 235 may be formed to fill the fifth, sixth, and seventh openings OP5, OP6, and OP7. The bit lines BL and the exposure lines 235 may have their top surfaces coplanar with that of the second buried dielectric layer 250. The exposure lines 235 may include third sub-pads 237 in the fifth openings OP5 and fourth sub-pads 239 in the sixth openings OP6. The third sub-pads 237 may have their widths less than those of the fourth sub-pads 239.

Through the processes mentioned above, a peripheral circuit structure PS may be formed.

If the cell array structure CS were to be provided with all of pads whose areas are larger, and when the peripheral circuit structure PS is provided with all of pads whose areas are smaller, a narrow spacing may be provided between the first and second openings OP1 and OP2 on the cell array structure CS, and a small spacing margin may be provided to the bit lines BL, or the first and second sub-pads BLa and BLb, which are formed when a polishing process is performed on the first conductive layer 156. As a result, defects may easily be generated in fabricating a semiconductor device.

In contrast, according to an embodiment, wide pads may be dominantly provided on one of the cell array structure CS and the peripheral circuit structure PS, wide pads and narrow pads may be formed to reside alternately on each of the cell array structure CS and the peripheral circuit structure PS. Accordingly, a large spacing margin may be provided to the bit lines BL, or the first and second sub-pads BLa and BLb, which are formed when a polishing process is performed on the first conductive layer 156, and defects may be less generated in fabricating a semiconductor device.

Referring to FIGS. 13 and 27, the cell array structure CS and the peripheral circuit structure PS may be bonded to each other. In an implementation, the second substrate 32 may be positioned on the first substrate 12. The second substrate 32 may allow the peripheral circuit structure PS to face the cell array structure CS. In this case, the peripheral circuit wiring layer 230 of the peripheral circuit structure PS may be aligned with the cell array wiring layer 160 of the cell array structure CS. In an implementation, the first sub-pads BLa may be aligned with the third sub-pads 237, and the second sub-pads BLb may be aligned with the fourth sub-pads 239. The exposure lines 235 of the peripheral circuit structure PS may be aligned with the connection lines CL and the peripheral connection lines PCL of the cell array structure CS.

The notches NT, discussed in FIG. 5, may be used to align the first substrate 12 and the second substrate 32 with each other.

Referring to FIGS. 13 and 14, the peripheral circuit structure PS may contact the cell array structure CS. In an implementation, the first sub-pads BLa may be coupled to the third sub-pads 237, and the second sub-pads BLb may be coupled to the fourth sub-pads 239. The exposure lines 235 of the peripheral circuit structure PS may be coupled to the connection lines CL and the peripheral connection lines PCL of the cell array structure CS. The second buried dielectric layer 250 of the peripheral circuit structure PS may be coupled to the third interlayer dielectric layer 155 of the cell array structure CS.

The peripheral circuit wiring layer 230 of the peripheral circuit structure PS may be coupled to the cell array wiring layer 160 of the cell array structure CS. In an implementation, the exposure line 235 of the peripheral circuit structure PS may be combined with each of the bit line BL, the connection line CL, and the peripheral connection line PCL of the cell array structure CS, such that the exposure line 235 and its combined any one of the bit line BL, the connection line CL, and the peripheral connection line PCL may be formed into a single body. The exposure lines 235 of the peripheral circuit structure PS may be automatically combined with the bit lines BL, the connection lines CL, and the peripheral connection lines PCL of the cell array structure CS. For example, the peripheral circuit wiring layer 230 and the cell array wiring layer 160 may include the same material (e.g., copper), and may be bonded to each other by an intermetallic hybrid bonding process (e.g., Cu—Cu hybrid bonding) due to a surface activation at an interface between the peripheral circuit wiring layer 230 and the cell array wiring layer 160 that are in contact with each other.

Afterwards, a cutting or sawing machine may be utilized to cut the first and second substrates 12 and 32 along the scribe line region, and therefore semiconductor devices formed on the first and second substrates 12 and 32 may be divided into a plurality of semiconductor chips.

A semiconductor device according to some embodiments may be configured such that one of first and second pads has a larger area. Therefore, even when upper and lower structures are misaligned due to process errors in semiconductor device fabrication, sub-pads whose areas are smaller may vertically and completely overlap sub-pads whose areas are larger, and a uniform contact area may be provided between the sub-pads. In an implementation, a contact resistance between first and second pads may be constant between the sub-pads. In conclusion, there may be provided a semiconductor device having increased electrical characteristics.

One or more embodiments may provide a semiconductor device with increased electrical characteristics.

One or more embodiments may provide a semiconductor device whose integration is high.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising a cell structure stacked on a peripheral circuit structure, wherein:
    the cell structure includes:
        a plurality of gate electrode layers stacked on a first substrate;
        a plurality of channel regions vertically penetrating the gate electrode layers;
        a first interlayer dielectric layer on the first substrate and covering the gate electrode layers and the channel regions; and
        a plurality of first metal pads exposed at the first interlayer dielectric layer and connected to the gate electrode layers and the channel regions,
    the peripheral circuit structure includes:
        at least one transistor on a second substrate;
        a second interlayer dielectric layer on the second substrate and covering the transistor; and
        a plurality of second metal pads exposed at the second interlayer dielectric layer and connected to the transistor,
    the plurality of first metal pads include at least one first sub-pad and at least one second sub-pad that are adjacent to each other,
    the plurality of second metal pads include at least one third sub-pad and at least one fourth sub-pad that are adjacent to each other,
    the at least one first sub-pad and the at least one third sub-pad are coupled to each other, and a width of the at least one first sub-pad is greater than a width of the at least one third sub-pad,
    the at least one second sub-pad and the at least one fourth sub-pad are coupled to each other, and a width of the at least one fourth sub-pad is greater than a width of the at least one second sub-pad,
    a distance between a lateral surface of the at least one first sub-pad and a lateral surface of the at least one second sub-pad adjacent to the at least one first sub-pad is substantially the same as a distance between a lateral surface of the at least one third sub-pad and a lateral surface of the at least one fourth sub-pad adjacent to the at least one third sub-pad, and
    the width of the at least one first sub-pad is substantially the same as the width of the at least one fourth sub-pad, and the width of the at least one second sub-pad is substantially the same as the width of the at least one third sub-pad.

2. The semiconductor device as claimed in claim 1, wherein, at an interface between the first interlayer dielectric layer and the second interlayer dielectric layer:
    an area of the at least one first sub-pad is greater than an area of the at least one third sub-pad such that, when viewed in a plan view, the at least one third sub-pad is in an inside of the at least one first sub-pad, and
    an area of the at least one fourth sub-pad is greater than an area of the at least one second sub-pad, and when viewed in a plan, the at least one second sub-pad is in an inside of the at least one fourth sub-pad.

3. The semiconductor device as claimed in claim 1, wherein:
    the at least one first sub-pad includes a plurality of first sub-pads, the at least one second sub-pad includes a plurality of second sub-pads, the at least one third sub-pad includes a plurality of third sub-pads, and the at least one fourth sub-pad includes a plurality of fourth sub-pads, and
    the plurality of first sub-pads and the plurality of second sub-pads are alternately arranged in one direction parallel to a top surface of the first substrate.

4. The semiconductor device as claimed in claim 1, wherein:
    the at least one first sub-pad includes a plurality of first sub-pads, the at least one second sub-pad includes a plurality of second sub-pads, the at least one third sub-pad includes a plurality of third sub-pads, and the at least one fourth sub-pad includes a plurality of fourth sub-pads,
    the plurality of first sub-pads are on a first region of the first substrate, and
    the plurality of second sub-pads are on a second region of the first substrate.

5. The semiconductor device as claimed in claim 1, wherein,
    the plurality of first metal pads further include a fifth sub-pad between the at least one first sub-pad and the at least one second sub-pad, the plurality of second metal pads further include a sixth sub-pad between the at least one third sub-pad and the at least one fourth sub-pad, the fifth sub-pad is coupled to the sixth sub-pad, and a width of the fifth sub-pad is the same as a width of the sixth sub-pad.

6. The semiconductor device as claimed in claim 5, wherein the fifth sub-pad and the sixth sub-pad are vertically aligned with each other.

7. The semiconductor device as claimed in claim 1, wherein, at an interface between the first interlayer dielectric layer and the second interlayer dielectric layer:

the at least one first sub-pad and the at least one third sub-pad constitute a single body formed of the same material, and the at least one second sub-pad and the at least one fourth sub-pad constitute a single body formed of the same material.

8. The semiconductor device as claimed in claim 1, wherein:

the width of the at least one first sub-pad is greater than the width of the at least one second sub-pad, and the width of the at least one third sub-pad is less than the width of the at least one fourth sub-pad.

9. The semiconductor device as claimed in claim 1, wherein the cell structure further includes a memory cell array, the memory cell array including:

a plurality of cell strings including a plurality of memory cells;

a plurality of word lines connected to the plurality of memory cells;

a plurality of bit lines connected to one side of the plurality of cell strings; and a ground selection line connected to the plurality of cell strings.

10. The semiconductor device as claimed in claim 1, wherein the distance between the lateral surface of the at least one first sub-pad and the lateral surface of the at least one second sub-pad adjacent to the at least one first sub-pad is about 0.1 µm to about 10 µm.

* * * * *